(12) United States Patent
Su et al.

(10) Patent No.: US 7,508,727 B2
(45) Date of Patent: Mar. 24, 2009

(54) MEMORY STRUCTURE AND DATA WRITING METHOD THEREOF

(75) Inventors: Keng-Li Su, Hsinchu Hsien (TW); Chin-Sheng Lin, Hsinchu (TW); Chia-Pao Chang, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 11/457,754

(22) Filed: Jul. 14, 2006

(65) Prior Publication Data
US 2007/0153567 A1 Jul. 5, 2007

(30) Foreign Application Priority Data
Dec. 30, 2005 (TW) .............................. 94147752 A

(51) Int. Cl.
*G11C 7/00* (2006.01)
(52) U.S. Cl. .................. 365/222; 365/199; 365/226
(58) Field of Classification Search ................. 365/222, 365/199, 226
See application file for complete search history.

(56) References Cited

U.S. PATENT DOCUMENTS

| | | | | | |
|---|---|---|---|---|---|
| 3,622,960 | A | * | 11/1971 | Barron et al. | 367/137 |
| 5,136,216 | A | * | 8/1992 | Wills et al. | 318/123 |
| 5,146,147 | A | * | 9/1992 | Wills et al. | 318/797 |
| 6,674,274 | B2 | * | 1/2004 | Hobrecht et al. | 323/285 |
| 2007/0139973 | A1 | * | 6/2007 | Leung | 363/16 |
| 2008/0017168 | A1 | * | 1/2008 | Lin et al. | 365/158 |

FOREIGN PATENT DOCUMENTS

TW 583666 4/2004

* cited by examiner

*Primary Examiner*—Thong Q Le
(74) *Attorney, Agent, or Firm*—Foley & Lardner LLP

(57) ABSTRACT

A memory structure and data writing method thereof includes a power supply circuit and a bridge circuit. The bridge circuit is driven by the power supply circuit, and operate in a plurality of conduction modes. The memory structure only requires one set of power supply circuit and does not need to know the resistance of the bit line in advance, also the signal error is hardly occurred when the memory structure is switching between positive and negative.

20 Claims, 24 Drawing Sheets

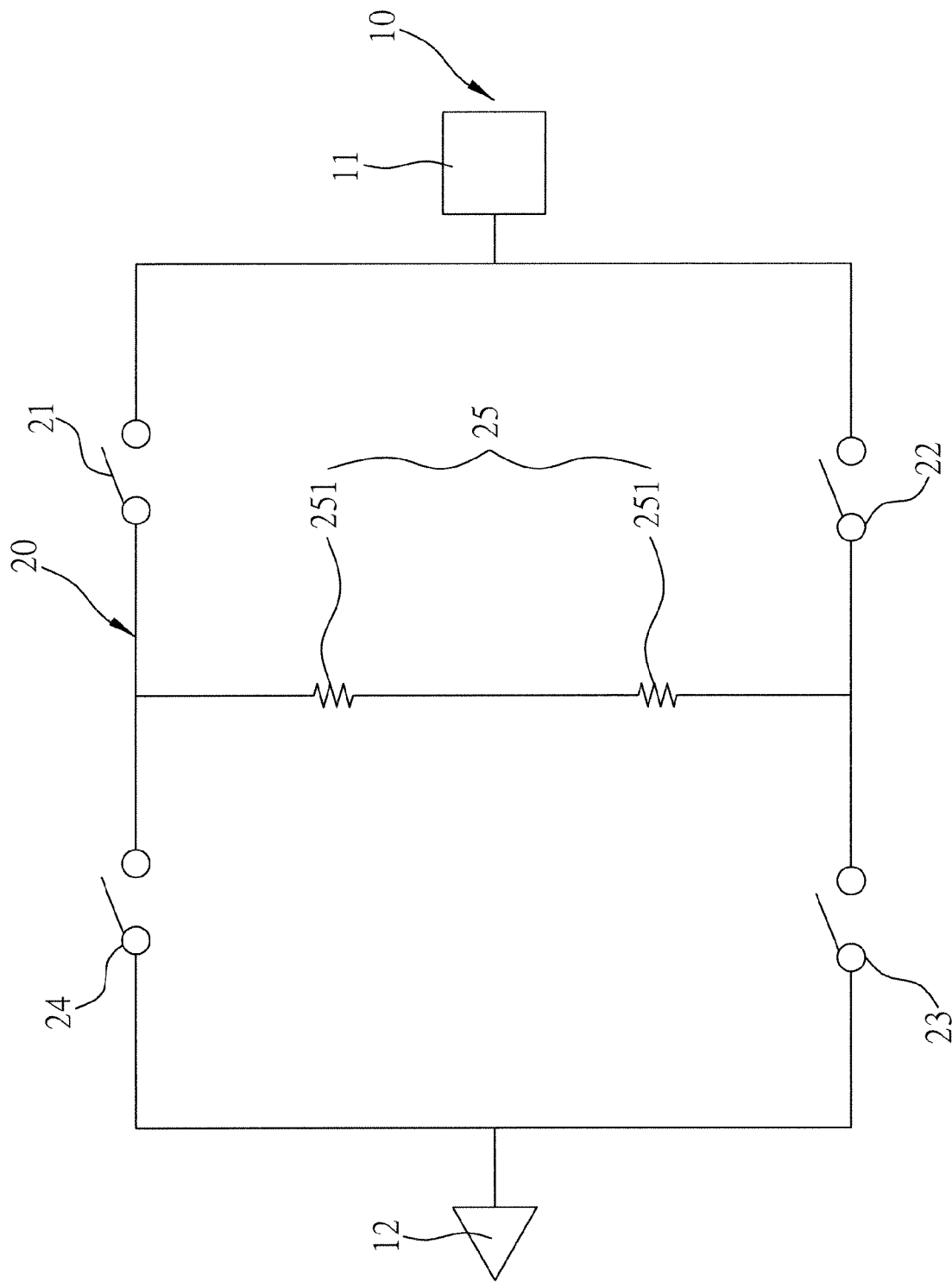

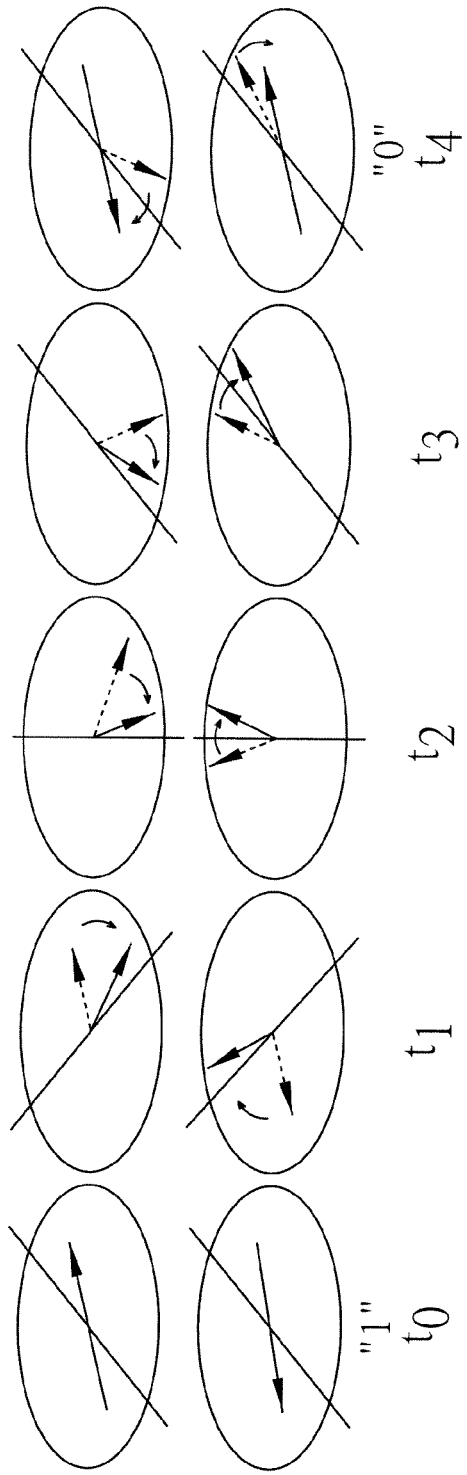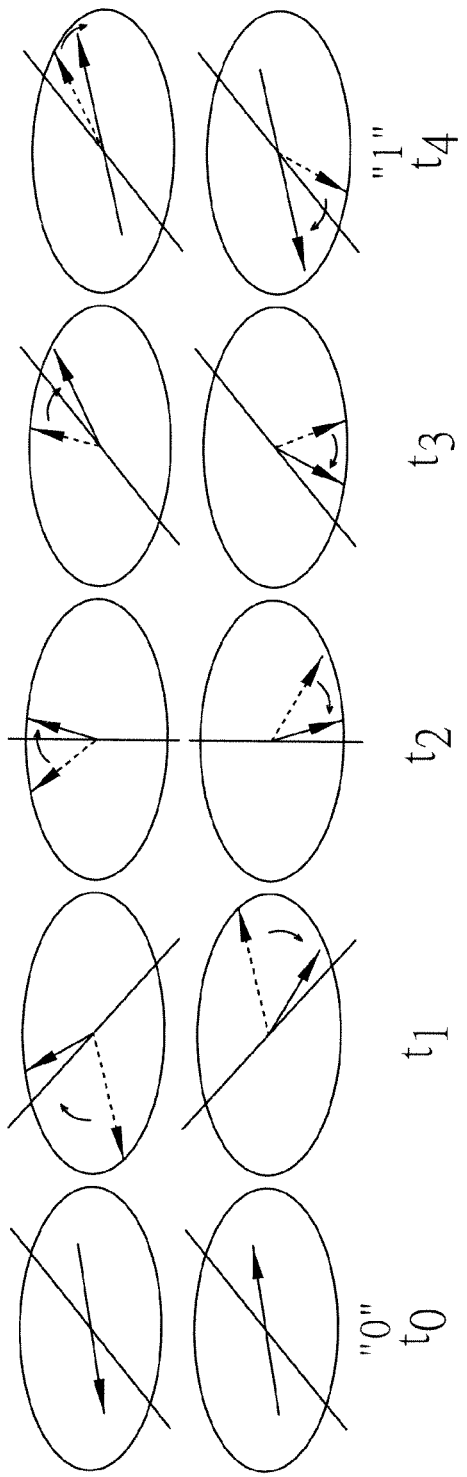
FIG. 14B (PRIOR ART)
FIG. 14C (PRIOR ART)

MEMORY STRUCTURE AND DATA WRITING METHOD THEREOF

FIELD OF THE INVENTION

The present invention relates to memory structures and data writing method thereof, and, more particularly, to a memory structure and a data writing method for a magnetic random access memory.

BACKGROUND OF THE INVENTION

The data writing method of MRAM is to use two wirings (Bit Line and Write World Line) to induce the cell interconnected by the magnetic field, in order to change the magnetoresistance value of the memory layer by changing the direction of the magnetization state of the magnetic material of the memory layer. Thus, when reading the memory information, uses the reading of the resistance value generated by flowing the current into the selected magnetic memory cell to judge the bit value of the memory information.

Referring to TW Patent No. 583666, it discloses a method to switch a magnetoresistive memory device by providing a magnetoresistive memory element close to a first conductor and a second conductor, wherein the magnetoresistive memory element includes a first magnetic region and a second magnetic region, and these two regions are divided by a tunneling barrier. At least one of the first and second magnetic regions comprises N ferromagnetic material layers that are antiferromagnetically coupled. N is an integral number equal or greater than two, and every single layer has an adjusted magnetic moment to provide a data writing mode. Every first and second magnetic region has a magnetic moment vector close to the tunneling barrier: at time t0, it is oriented in a preferable direction; at time t1, it is connected to a first current flowing through the first conductor; at time t2, it is connected to a second current flowing through the second conductor; at time t3, it cuts the first current flowing through the first conductor; at time t4, it cuts the second current flowing through the second conductor and this makes the magnetic moment closing to the tunneling barrier positioned in a direction different to the initial preferable direction at time t0.

Conventional magnetoresistive memory device uses toggle mode to increase the data writing selectivity, in order to push the magnetoresistive memory close to the mass production stage. Referring to FIGS. 14A, 14B, 14C, 14E and 14E, they are the schematic views showing the time sequence and the data writing mode of the conventional magnetoresistive memory device according to the embodiment. The magnetoresistive memory applies a word current 30 and a bit current 40 to the magnetic field to cause a throughput of the magnetic field to rotate the effective magnetic moment vector of the magnetoresistive memory device 180 degree. However, because of the disturbance from the exposed magnetic field, the initial direction of the magnetoresistive memory device at time t0 is often being deflected and sometimes causing data writing error. Therefore, the magnetoresistive memory device disclosed from the patent mentioned above uses a negative current to flow through before data writing, in order to deflect the magnetoresistive memory back to the correct initial direction at time t0 to resolve the disturbance from the exposed magnetic field, and hence increases the ratio of the correct data writing.

Although the magnetoresistive memory has advantages of non-volatility, high density, fast read/write and high endurance, but because of the especial toggle mode, a larger data writing magnetic field is required. Therefore, it is easy to cause a larger data writing current and increases the difficulty to match with other peripheral devices. However, although the switching method for the magnetoresistive memory mentioned above can reduce the data writing current and increase the magnetoresistive memory's correct data writing rate, but how to generate the forward and backward current mentioned in this method has become a problem for the related researchers.

Therefore, how to develop a memory structure with a simple structure, a fixed current, and is able to generate the forward and backward current has become an urgent problem for the related researching field.

SUMMARY OF THE INVENTION

In light of the above drawbacks in the prior art, an objective of the present invention is to provide a memory structure and data writing method thereof that is simple in structure and only requires one set power supply circuit.

Another objective of the present invention is to provide a memory structure and data writing method thereof that is able to provide a positive pulse and a negative pulse.

A further objective of the present invention is to provide a memory structure and data writing method thereof that can apply the current form the power supply circuit straight without knowing the resistance of the bit line in advance.

In accordance with the above and other objectives, the present invention of a memory structure and data writing method thereof includes a power supply circuit with an input terminal and an output terminal, and a bridge circuit electrically connected to the power supply circuit having a first switch, a second switch, a third switch and a fourth switch to form a two-phase circuit.

The memory structure of the present invention is applying the power supply circuit to drive the bridge circuit to generate a plurality of conduction modes that include: when the first and third switches are conductive (close), and the second and fourth switches are not conductive (open), the current flows from the input terminal to the resistance component via the first switch to generate a first pulse, then flows to the output terminal via the third switch; when the second and fourth switches are in conduction, and the first and third switches are in non-conduction, the current flows from the input terminal to the resistance component via the second switch to generate a second pulse, then flows to the output terminal via the fourth switch; and when the first, second, third and fourth switches are all in non-conduction, the current from the input terminal does not flow through any switches, hence generates a third pulse.

BRIEF DESCRIPTION OF THE DRAWINGS

FIG. 1 is a schematic structure view showing a memory structure of the present invention;

FIGS. 14B, 14C, 14D and 14E are schematic views showing the data writing mode of the conventional magnetoresistive memory device according to the embodiment.

DETAILED DESCRIPTION OF THE PREFERRED EMBODIMENTS

Figure 2A:
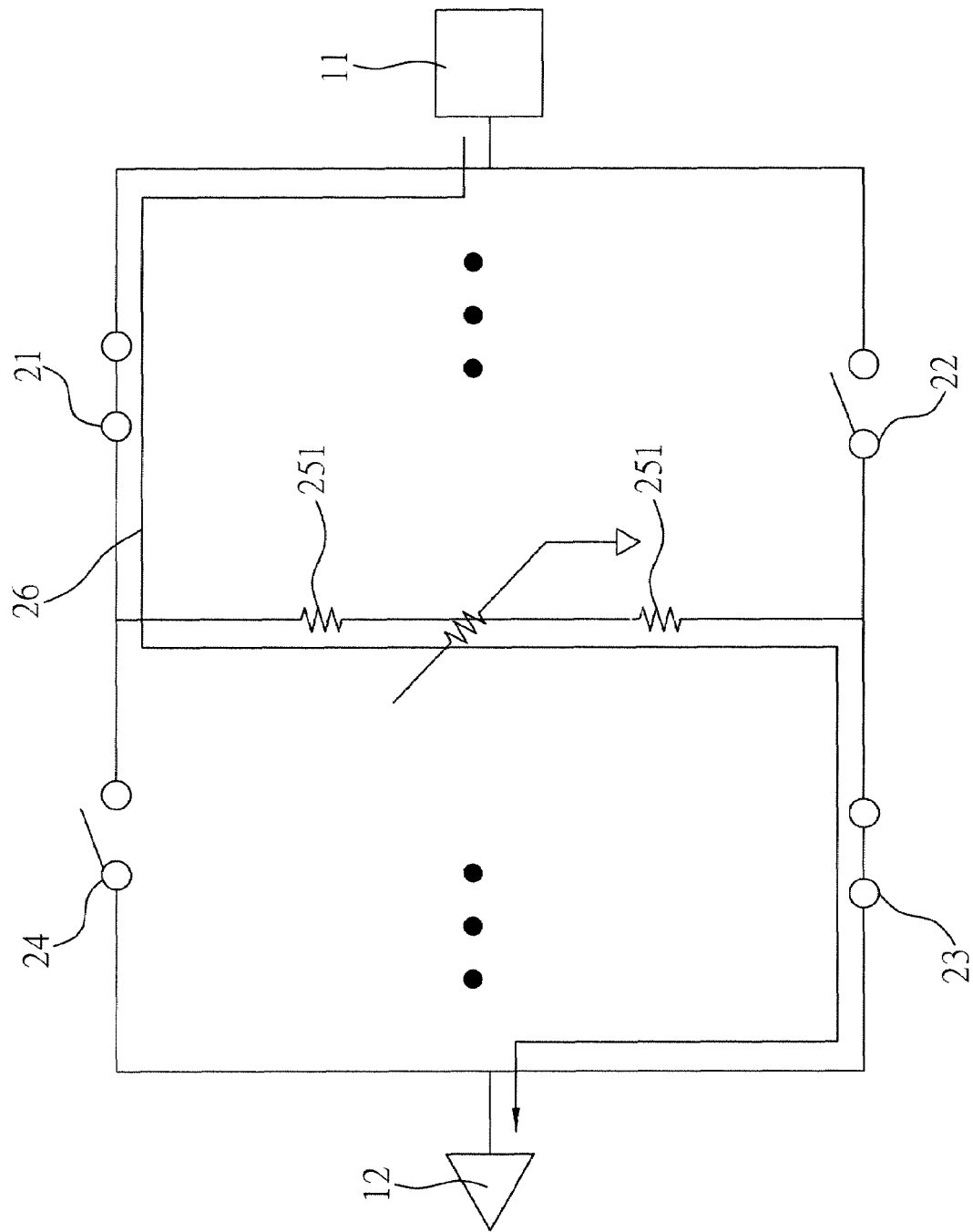
FIGS. 2A, 2B and 2C are schematic structure views showing different conduction mode of the memory structure of the present invention.

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIG. 1 is a circuit diagram of a memory structure of the present invention. The memory structure of the present invention comprises a power supply circuit 10 and a bridge circuit 20. The bridge circuit 20 is driven by the power supply circuit 10, and operates in a plurality of conduction modes. The power supply circuit 10 comprises an input terminal 11 and an output terminal 12. The bridge circuit 12 comprises a first switch 21, a second switch 22, a third switch 23 and a fourth switch 24, all of which are used for forming a two-phase circuit. Two opposite junctions of the bridge circuit 20 are connected to the input terminal 11 and the output terminal 12 respectively, and another two opposite junctions of the bridge circuit 20 serve as conduction paths for currents.

The first switch 21, second switch 22, third switch 23 and fourth switch 24 of the bridge circuit 20 mentioned above can be assembled from the group consisting of P-channel field effect transistor (FET) and N-channel FET, or a transmission gate assembled by P-channel FET and N-channel FET, or P-channel FET, N-channel FET and transmission gate. For example, the bridge circuit 20 can be composed of two P-channel FETs and two N-channel FETs. The P-channel and N-channel FETs forms a positive half-cycled drive and a negative half-cycled drive. The bridge circuit 20 further comprises a resistance component 25 (also called bit line) connected to the another two junctions of the bridge circuit 20. The resistance component 25 comprises a resistance of a bit line 251.

FIGS. 2A, 2B, 2C and 3 are four views showing the structure under different conduction modes and the conduction waveform of the memory structure of the present invention. The bridge circuit 20 is driven by currents generated by the power supply circuit 10 to operate in the connection modes.

As shown in FIG. 2A, when the first and third switches 21, 23 are conductive, and the second and fourth switches 22, 24 are not conductive, currents 26 travels from the input terminal 11 of the power supply circuit 10 to the resistance component 25 via the first switch 21. The resistance component 25 generates currents flowing downward. The downward-flowing currents are called first pulses 261. The first pulses 261, also known as positive pulse, then flow to the output terminal 12 of the power supply circuit 10 via the third switch 23.

Figure 2B:
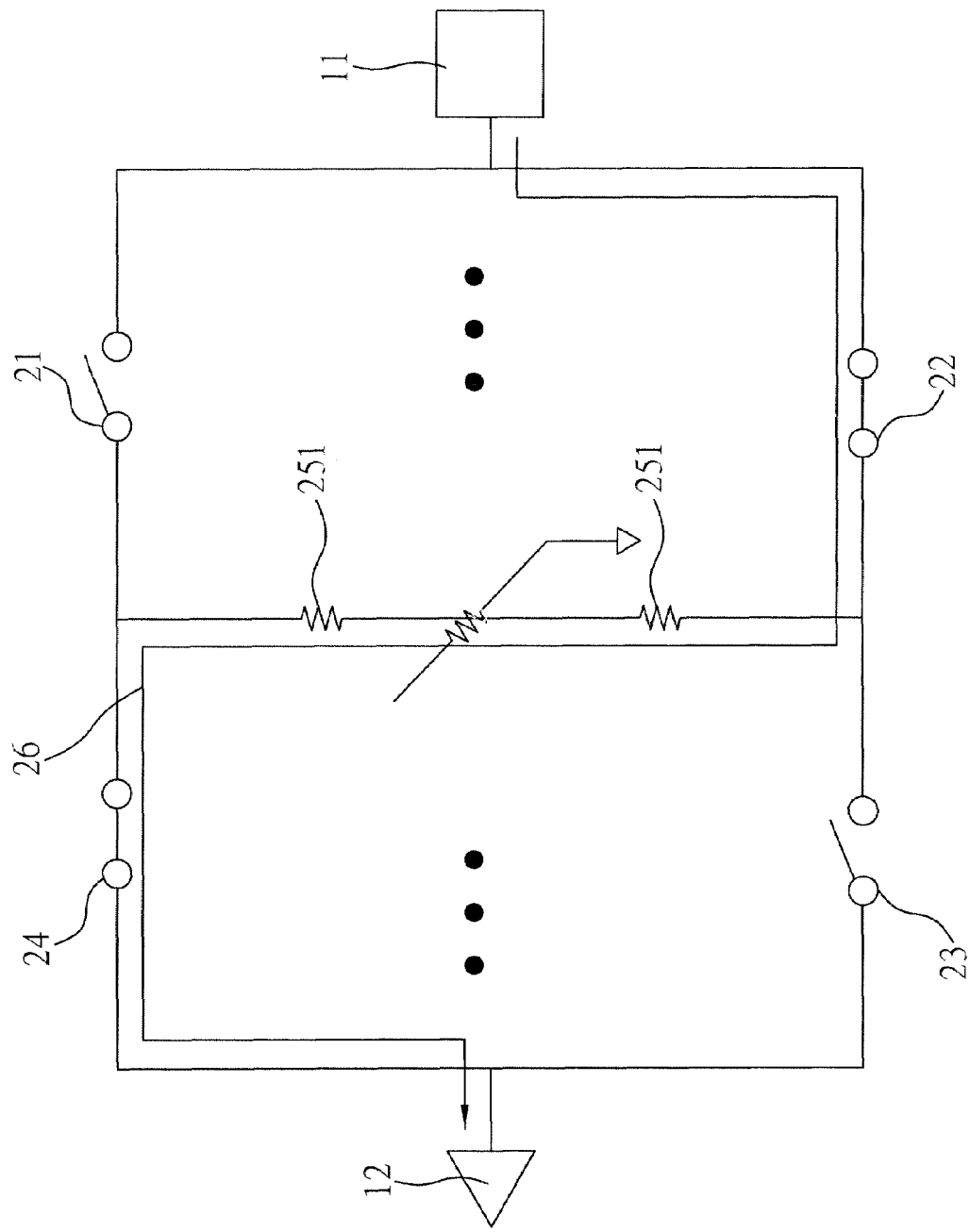

As shown in FIG. 2B, when the second and fourth switches 22, 24 are conductive, and the first and third switches 21, 23 are not conductive, the currents 26 flow from the input terminal 11 of the power supply circuit 10 to the resistance component 25 via the second switch 22. The resistance component 25 generates another currents flowing upward. The upward-flowing currents are also called second pulses 262. The second pulses 262, also known as negative pulse, then flow to the output terminal 12 of the power supply circuit 10 via the fourth switch 24.

Figure 2C:
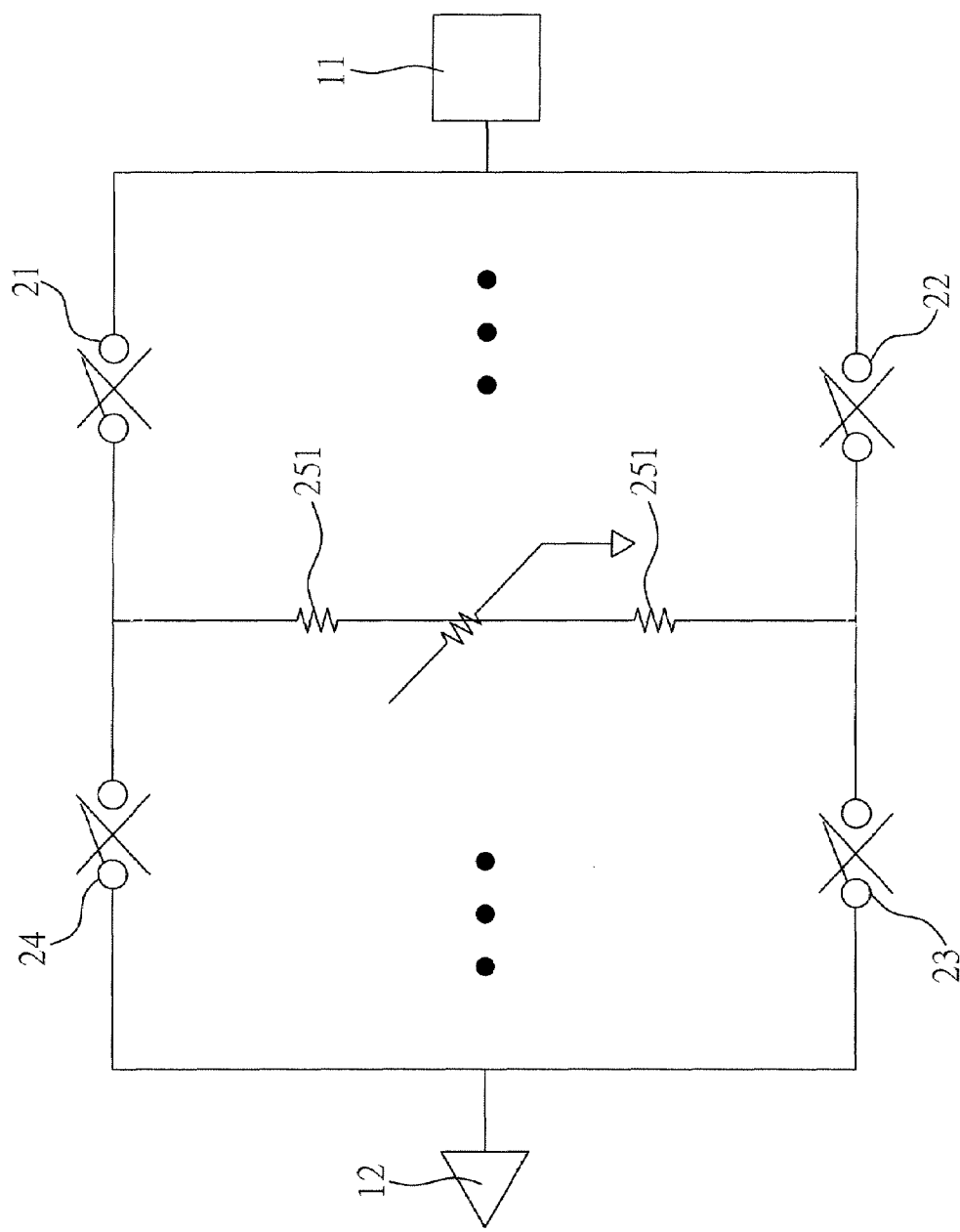
Figure 3:
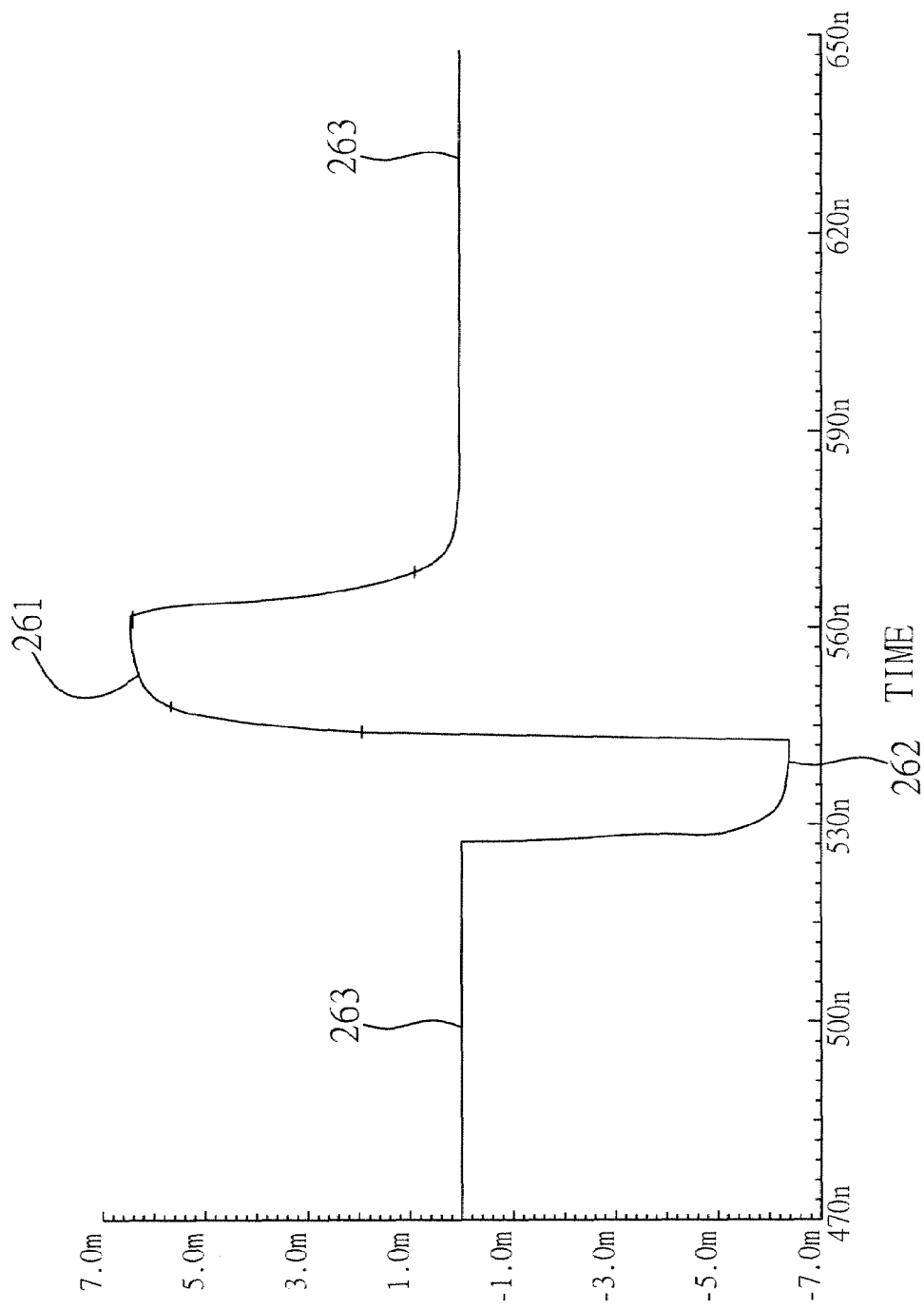
FIG. 3 is a graph showing the waveform in conduction of the memory structure of the present invention.

As shown in FIG. 2C, when the first, second, third and fourth switches 21, 22, 23, 24 are all not conductive, the currents 26 flew from the input terminal 11 of the power supply circuit 10 do not flow through any bit line (the resistance component 25). Therefore, third pulses 263 are generated. The third pulses 263 are known as common pulses.

Besides, the memory structure of the present invention can be altered according to the reality needs. FIGS. 4A, 4B, 5A, 5B, 6A and 6B are six views showing the structure and the conduction waveform of the memory structure according to different embodiments of the present invention.

Figures 4A, 4B:
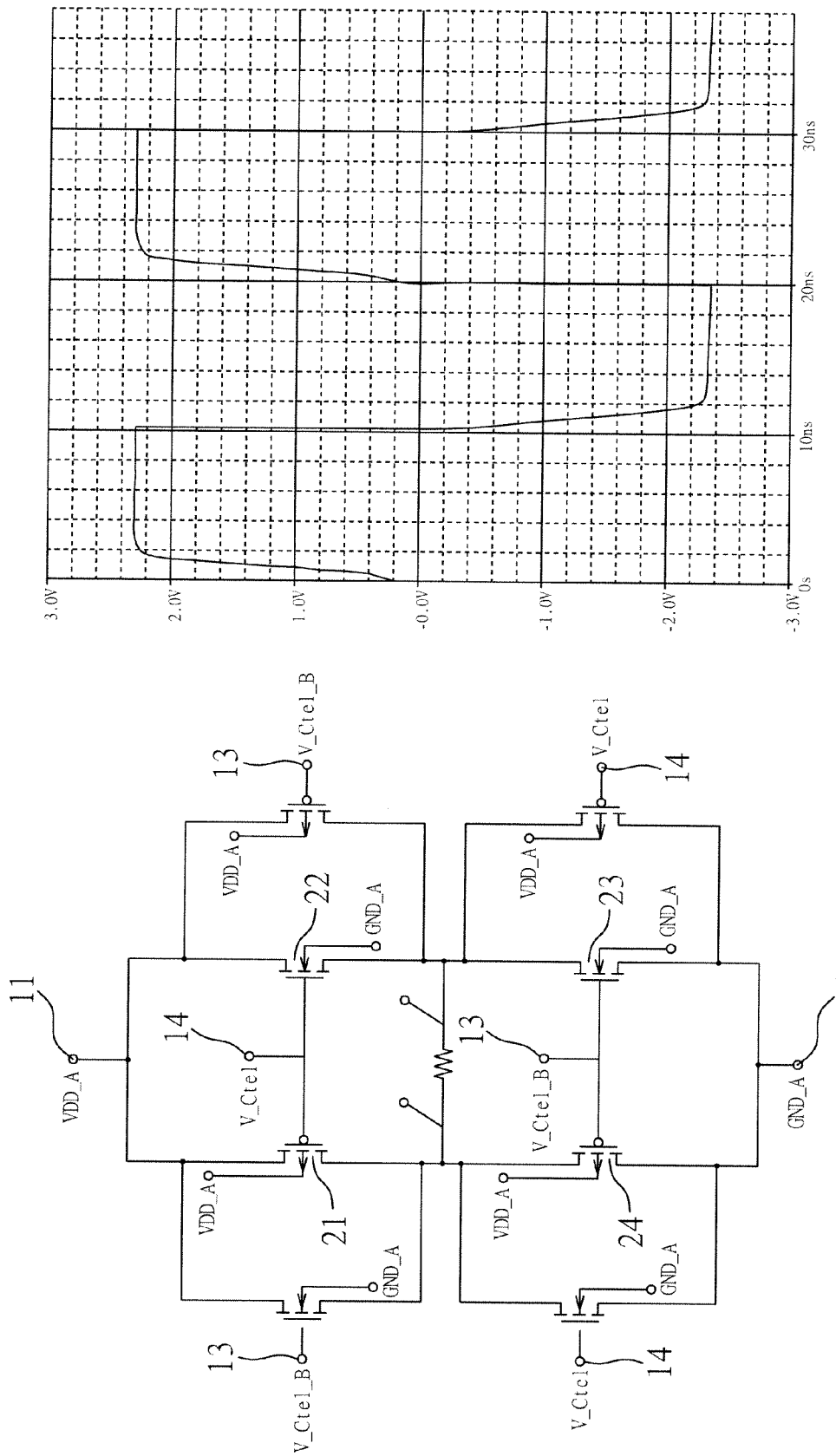
FIG. 4A is a schematic structure view of the memory structure according to the first embodiment of the present invention.
FIG. 4B is a graph showing the simulated waveform of the memory structure according to the first embodiment of the present invention.

FIGS. 4A and 4B are two schematic diagrams showing the structure and the simulated waveform of the memory structure according to a first embodiment of the present invention. The switch is assembled by transmission gate that is consisted of P-channel FET and N-channel FET. The first switch 21, third switch 23, second switch 22 and fourth switch 24 of the full bridge circuit share a first control signal (V_Ctrl_B) 13 and a second control signal (V_Ctrl) 14. Thus, when the memory structure switches between positive and negative, the full bridge circuit uses the first and second control signal 13, 14 respectively, leads to that the first and second control signal 13, 14 can be adjusted separately to avoid the error occurred therein. That means the full bridge circuit will not be in conduction for all switches at the same time, and hence the possibility of occurring signal errors is reduced.

Figure 5B:
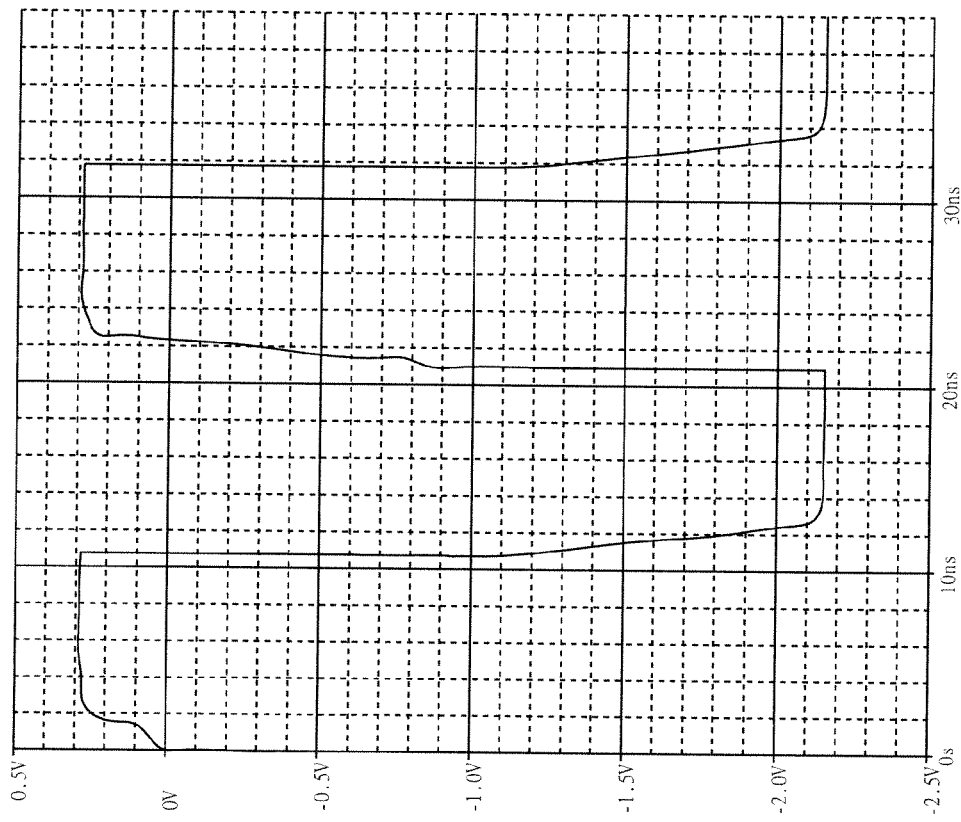
FIG. 5B is a graph showing the simulated waveform of the memory structure according to the second embodiment of the present invention.
Figure 5A:
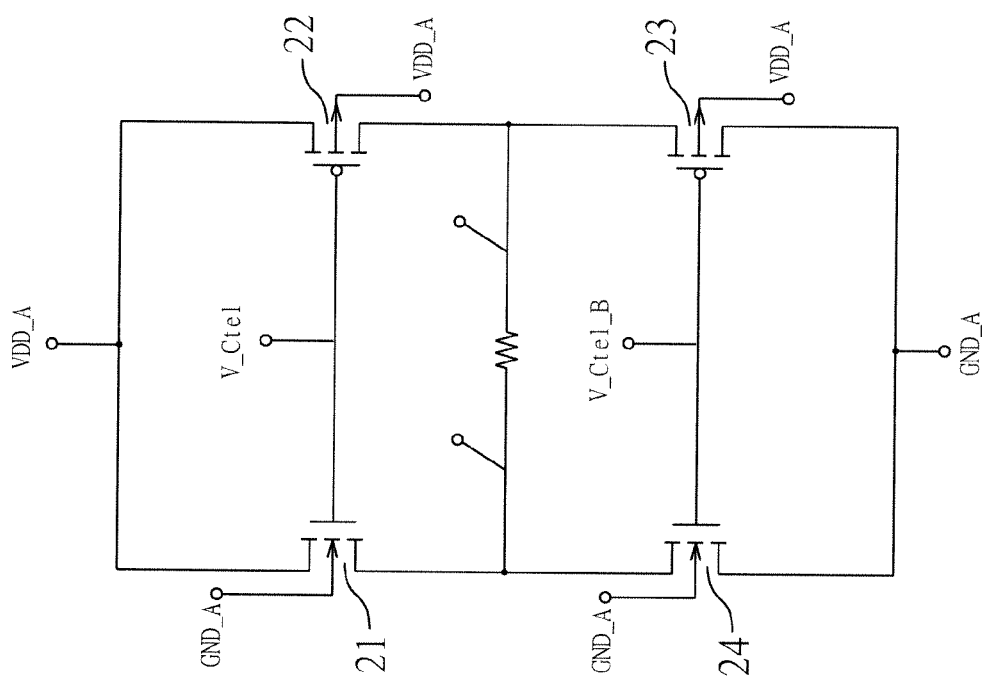
FIG. 5A is a schematic structure view of the memory structure according to the second embodiment of the present invention.

FIGS. 5A and 5B are two schematic diagrams showing the structure and the simulated waveform of the memory structure according to the second embodiment of the present invention. The first and fourth switches 21, 24 of the full bridge circuit are N-channel FETs, and the second and third switches 22, 23 of the full bridge circuit are P-channel FETs. Through the different characteristics of the P-channel FET and N-channel FET, positive and negative pulses with different magnitude are generated.

Figure 6B:
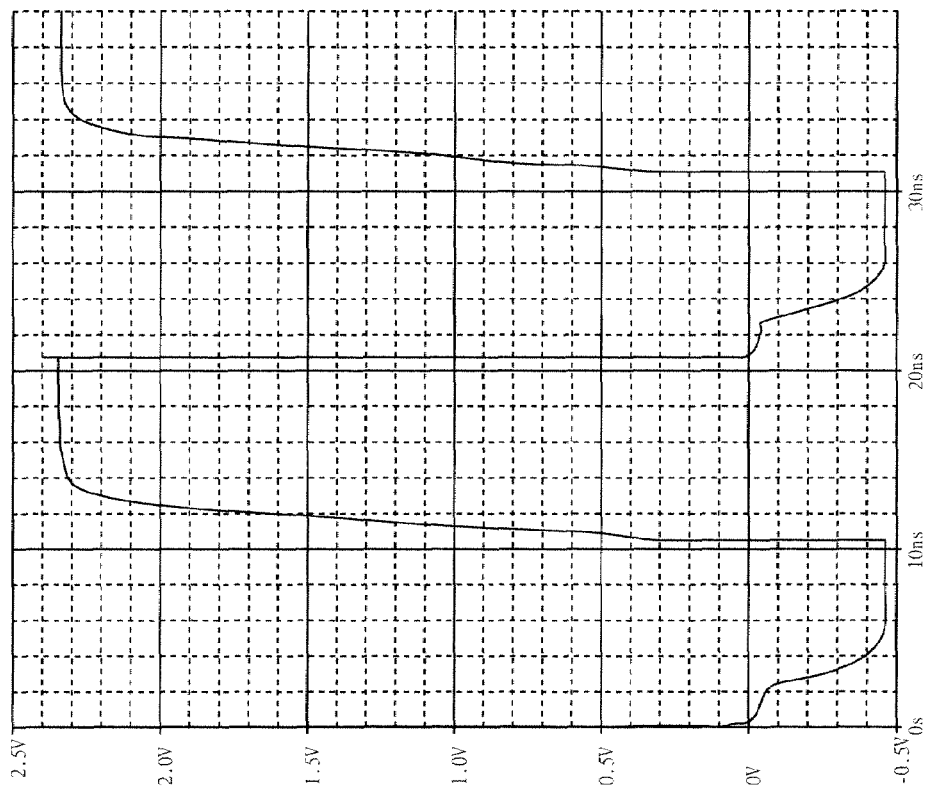
FIG. 6B is a graph showing the simulated waveform of the memory structure according to the third embodiment of the present invention.
Figure 6A:
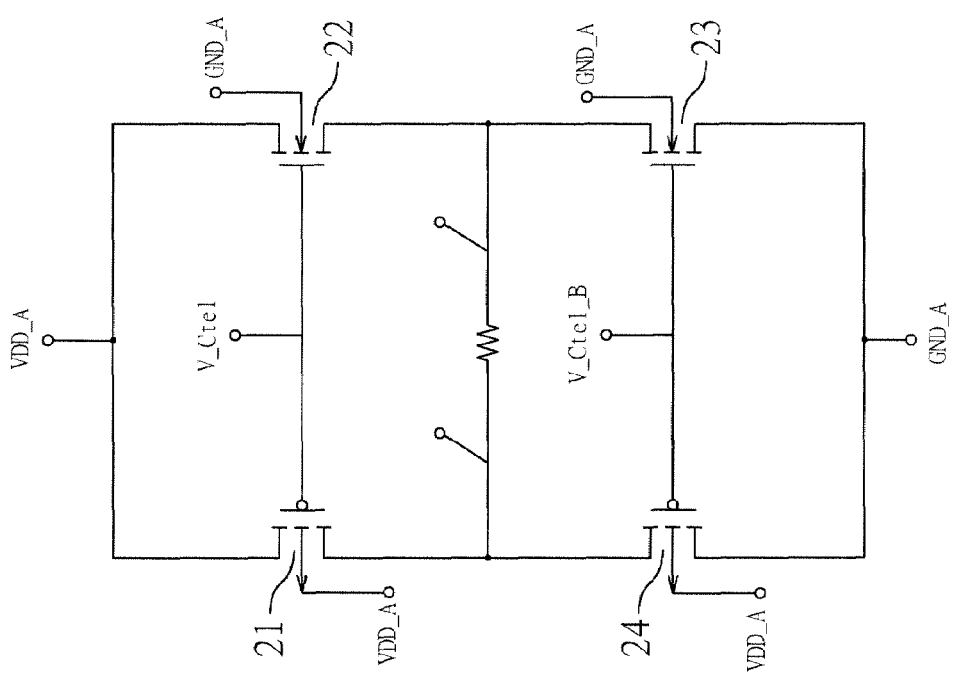
FIG. 6A is a schematic structure view of the memory structure according to the third embodiment of the present invention.

FIGS. 6A and 6B are two schematic diagrams showing the structure and the simulated waveform of the memory structure according to the third embodiment of the present invention. The present embodiment is most similar to the previous second embodiment, the only difference is that at the present embodiment, the first and fourth switches 21, 24 of the full bridge circuit are P-channel FETs and the second and third switches 22, 23 of the full bridge circuit are N-channel FETs. Through the different characteristics of the FETs mentioned above, positive and negative pulses with different magnitude are generated.

Figure 7B:
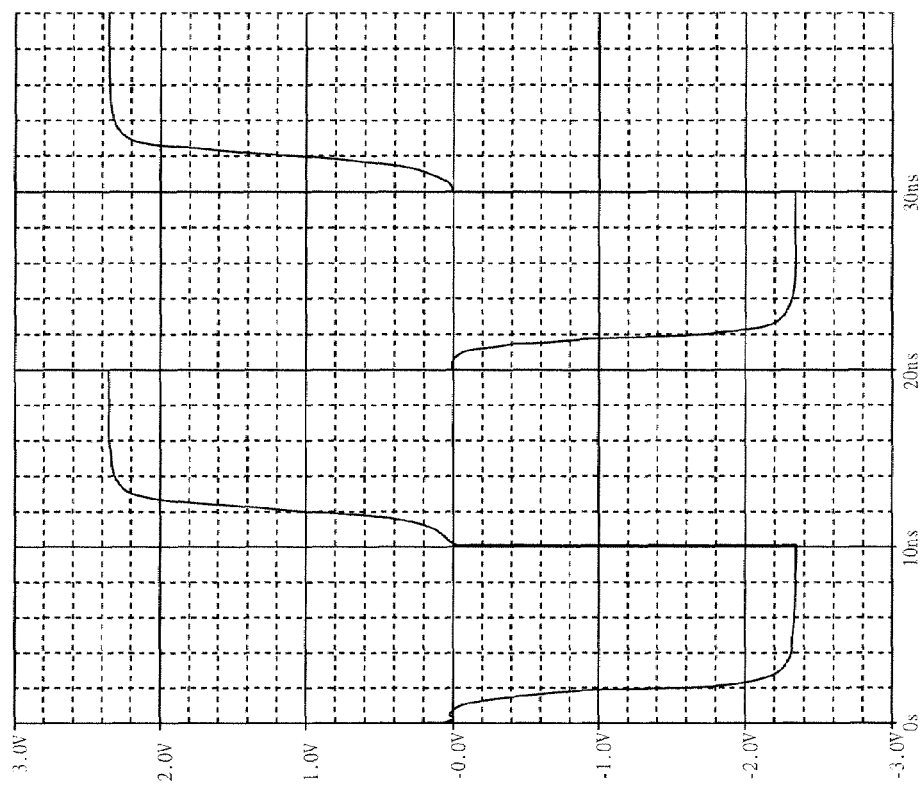
FIG. 7B is a graph showing the simulated waveform of the memory structure according to the fourth embodiment of the present invention.
Figure 7A:
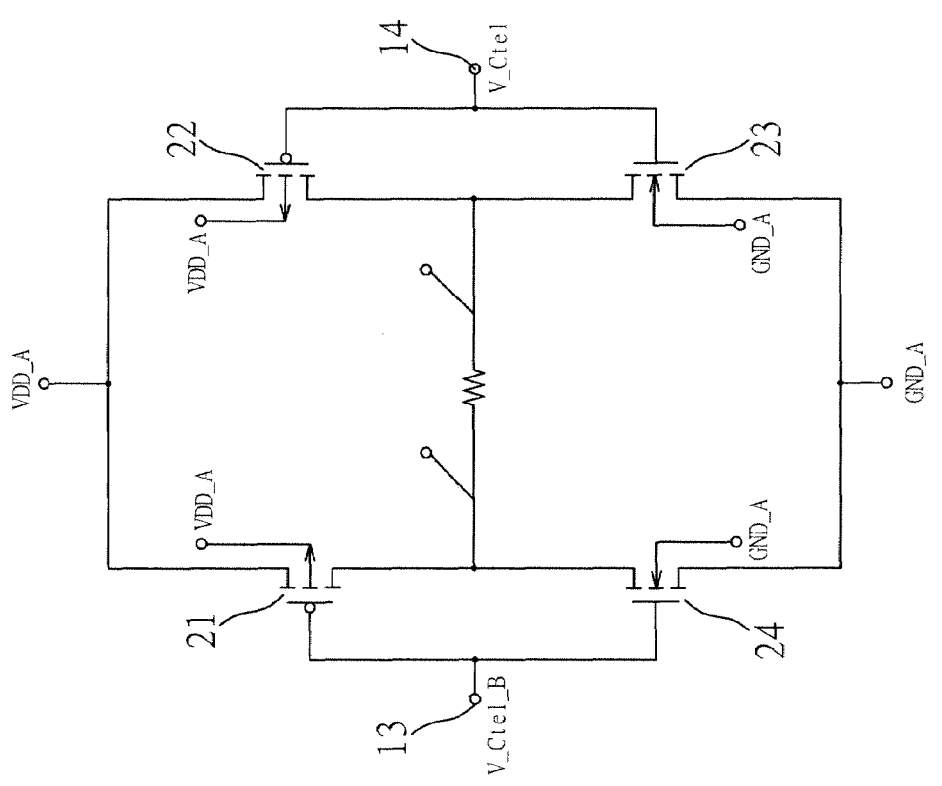
FIG. 7A is a schematic structure view of the memory structure according to the fourth embodiment of the present invention.

As shown in FIGS. 7A and 7B, they are schematic diagrams showing the structure and the simulated waveform of the memory structure according to the fourth embodiment of the present invention. The first and second switches 21, 22 of the full bridge circuit are P-channel FETs and the third and fourth switches 23, 24 of the full bridge circuit are N-channel FETs. Also the first and fourth switches 21, 24 share an externally connected first control signal 13 and the second and third switches 22, 23 share a second control signal 14 in order to produce a time-lagging, and symmetrical positive and negative pulses are generated.

Figure 8A:
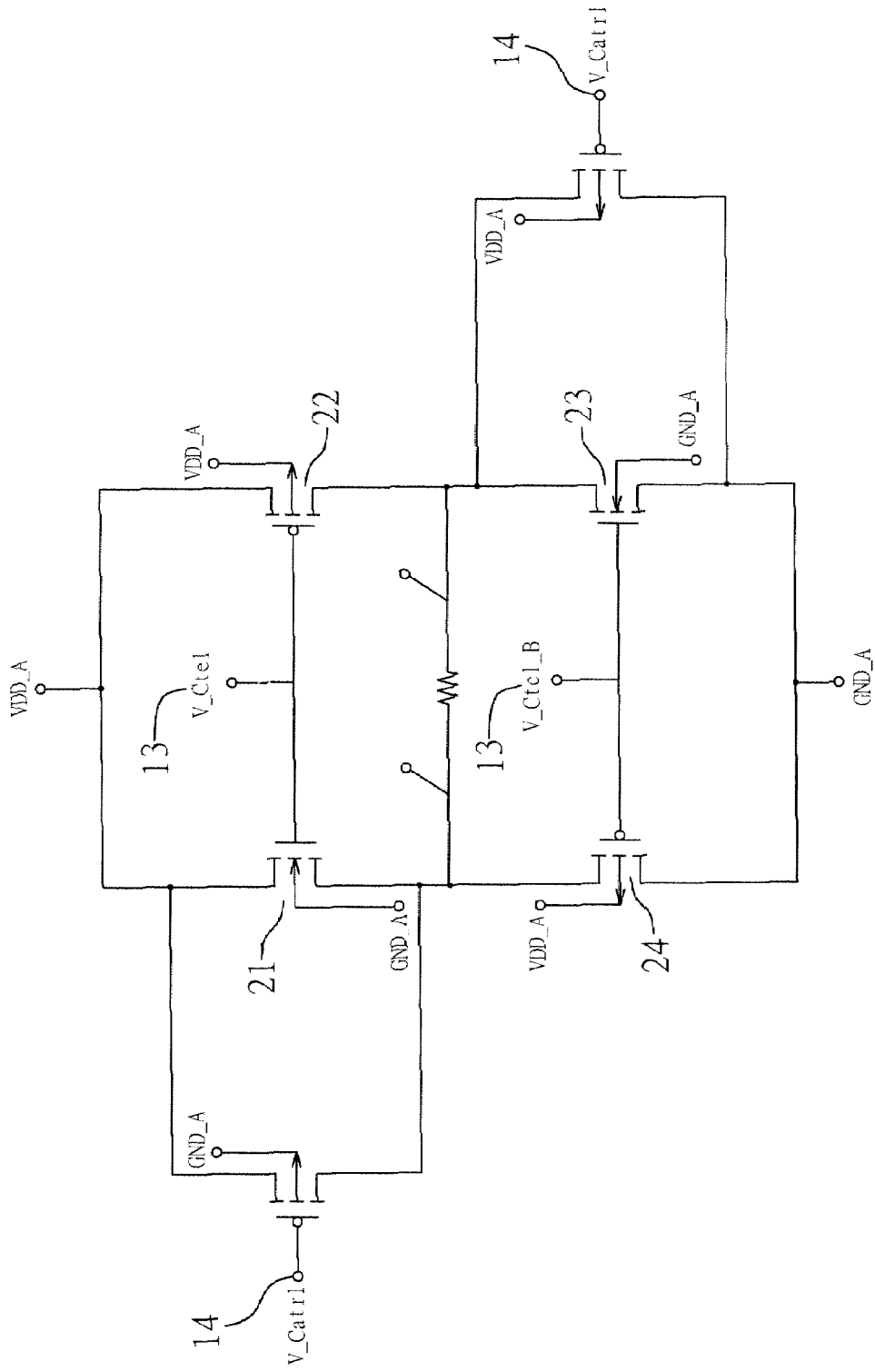
FIG. 8A is a schematic structure view of the memory structure according to the fifth embodiment of the present invention.
Figure 8B:
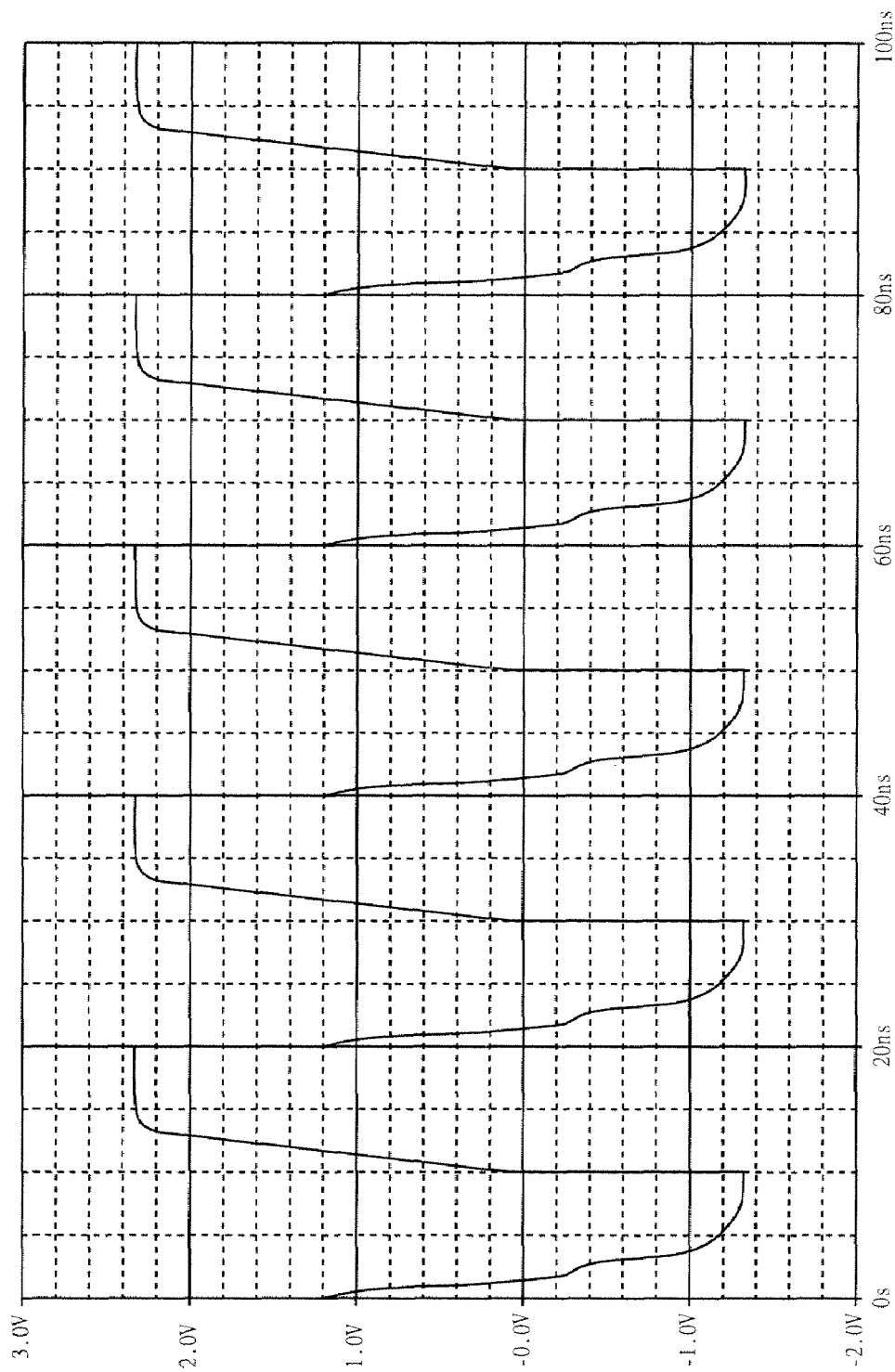
FIG. 8B is a graph showing the simulated waveform of the memory structure according to the fifth embodiment of the present invention.

As shown in FIGS. 8A and 8B, they are schematic diagrams showing the structure and the simulated waveform of the memory structure according to the fifth embodiment of the present invention. The present embodiment is most similar to the previous first embodiment, the only difference is that at the present embodiment, the first and third switches 21, 23 of the full bridge circuit is a transmission gate consisted of P-channel FET and N-channel FET, and the second and fourth switches 22, 24 of the full bridge circuit are P-channel FETs. Through the different characteristics of the FETs mentioned above, positive and negative pulses with different magnitude are generated.

Figure 9A:
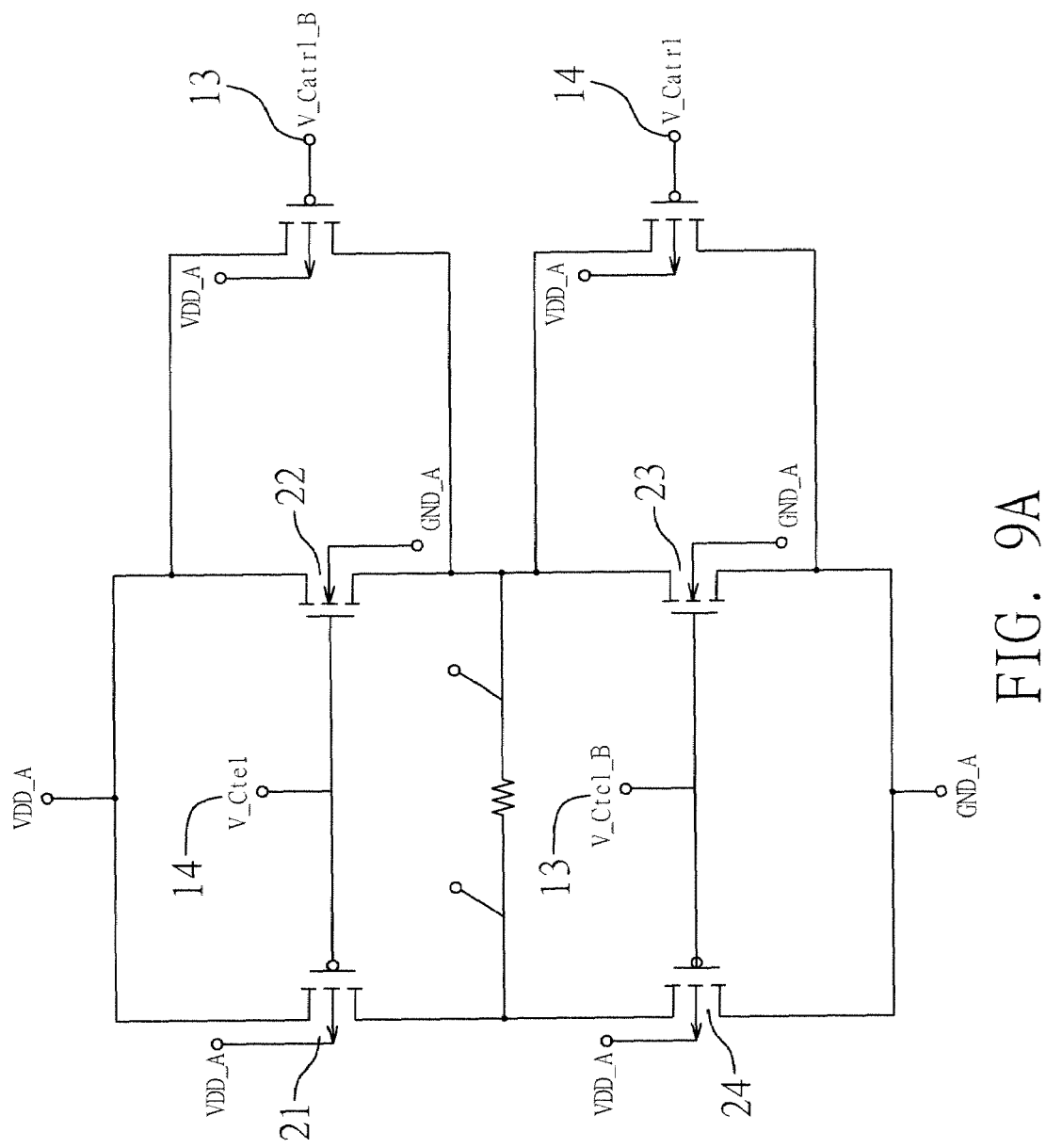
FIG. 9A is a schematic structure view of the memory structure according to the sixth embodiment of the present invention.
Figure 9B:
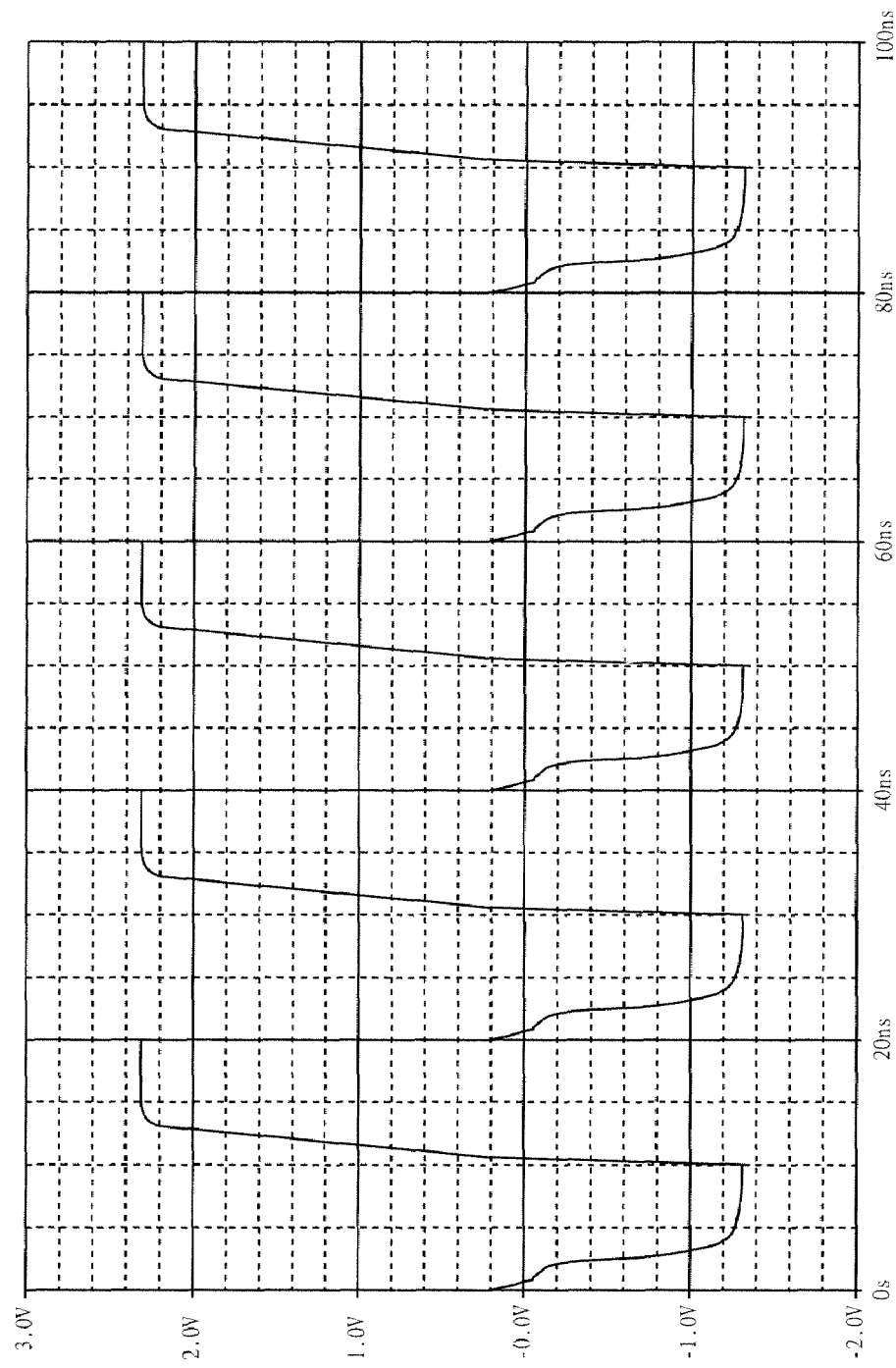
FIG. 9B is a graph showing the simulated waveform of the memory structure according to the sixth embodiment of the present invention.

As shown in FIGS. 9A and 9B, they are schematic diagrams showing the structure and the simulated waveform of the memory structure according to the sixth embodiment of the present invention. The present embodiment is most similar to the previous first embodiment, the only difference is that at the present embodiment, the second and third switches 22, 23 of the full bridge circuit is a transmission gate and the first and fourth switches 21, 24 of the full bridge circuit are P-channel FETs. Through the different characteristics of the FETs mentioned above, positive and negative pulses with different magnitude are generated.

Figure 10A:
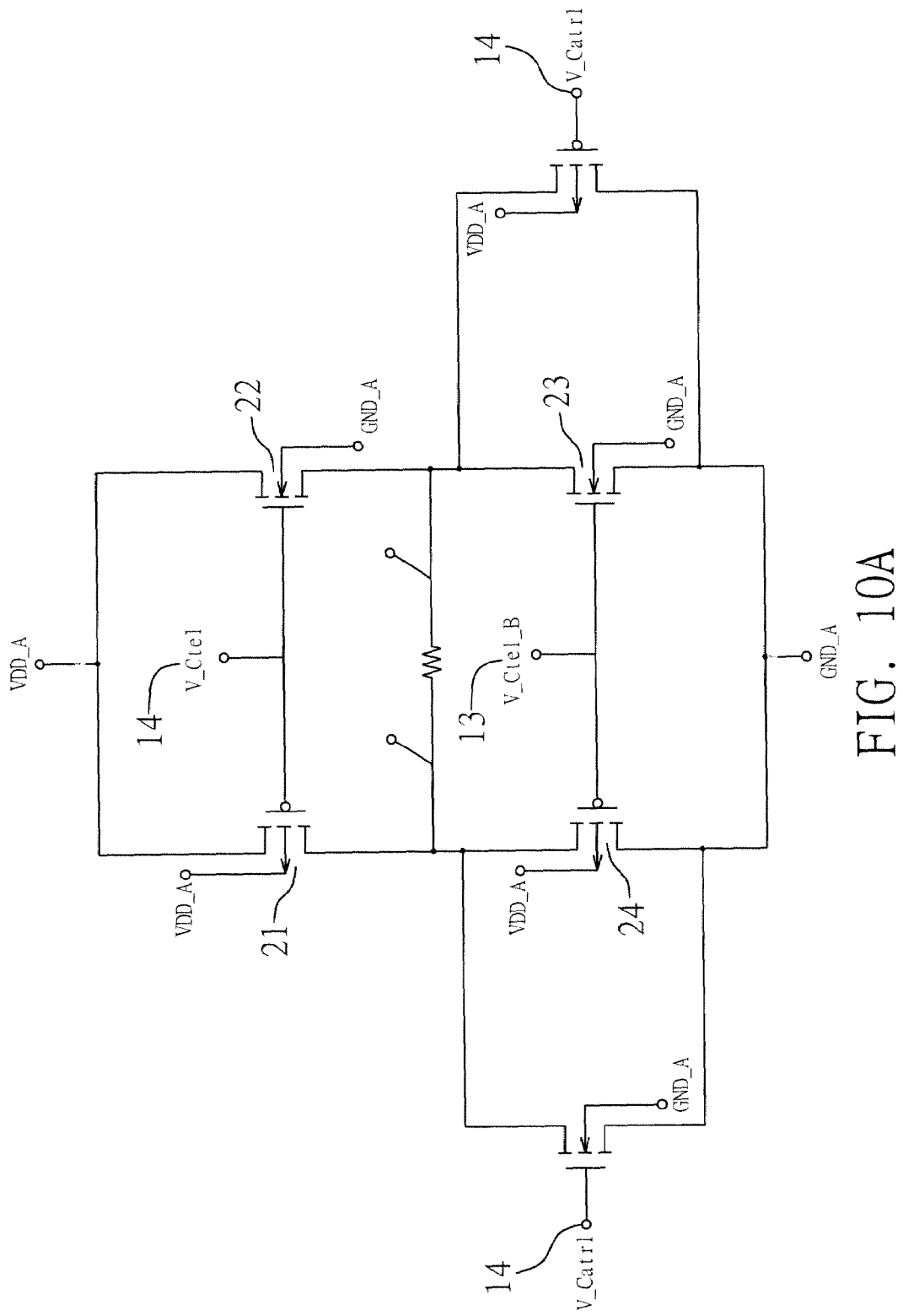
FIG. 10A is a schematic structure view of the memory structure according to the seventh embodiment of the present invention.
Figure 10B:
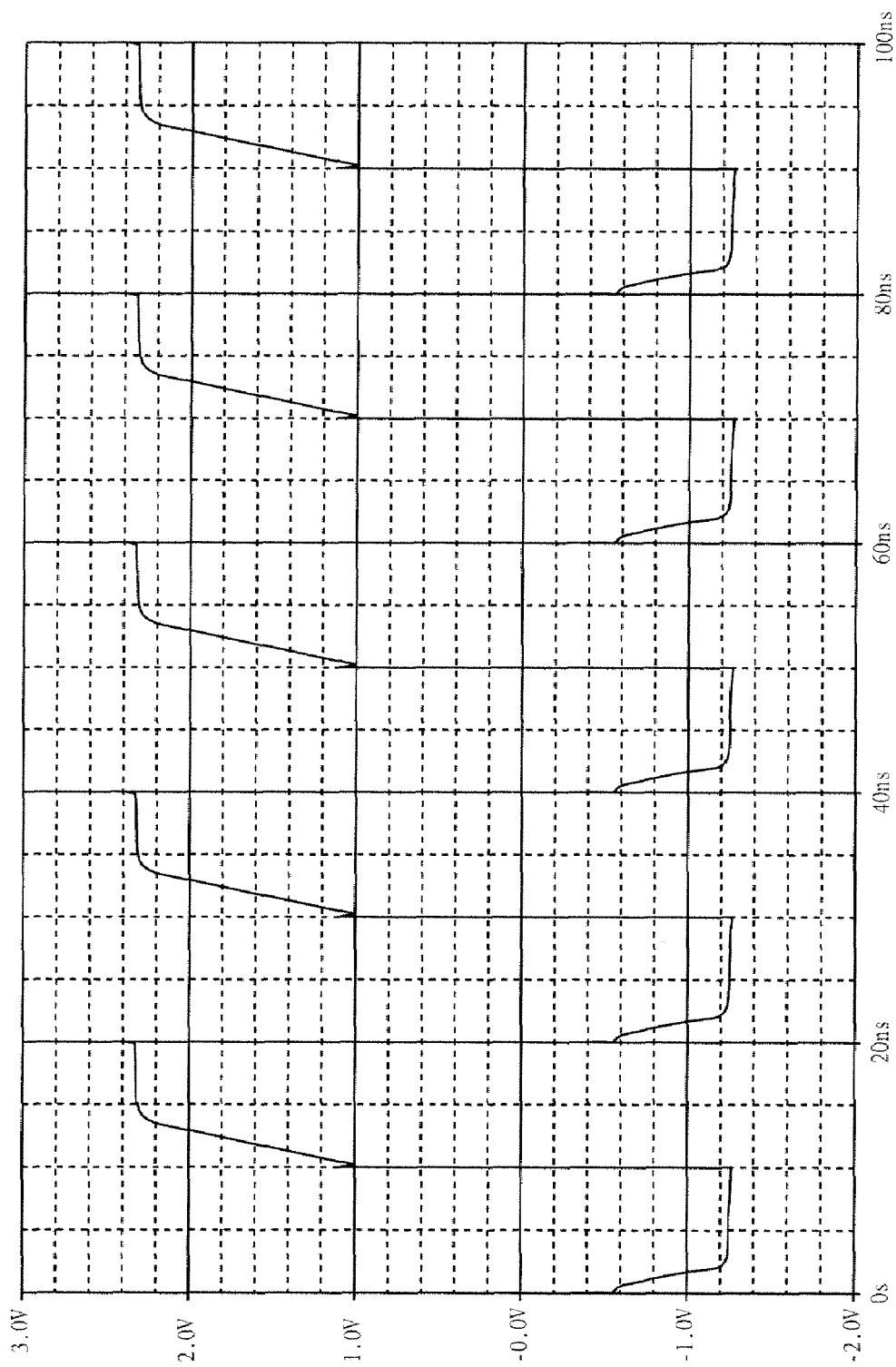
FIG. 10B is a graph showing the simulated waveform of the memory structure according to the seventh embodiment of the present invention.

As shown in FIGS. 10A and 10B, they are schematic diagrams showing the structure and the simulated waveform of the memory structure according to the seventh embodiment of the present invention. The present embodiment is most similar to the previous first embodiment, the only difference is that at the present embodiment, the third and fourth switches 23, 24 of the full bridge circuit is a transmission gate, the first switch 21 of the full bridge circuit is P-channel FET and the second switch 22 of the full bridge circuit is N-channel FET. Through the different characteristics of the FETs mentioned above, positive and negative pulses with different magnitude are generated.

Figure 11A:
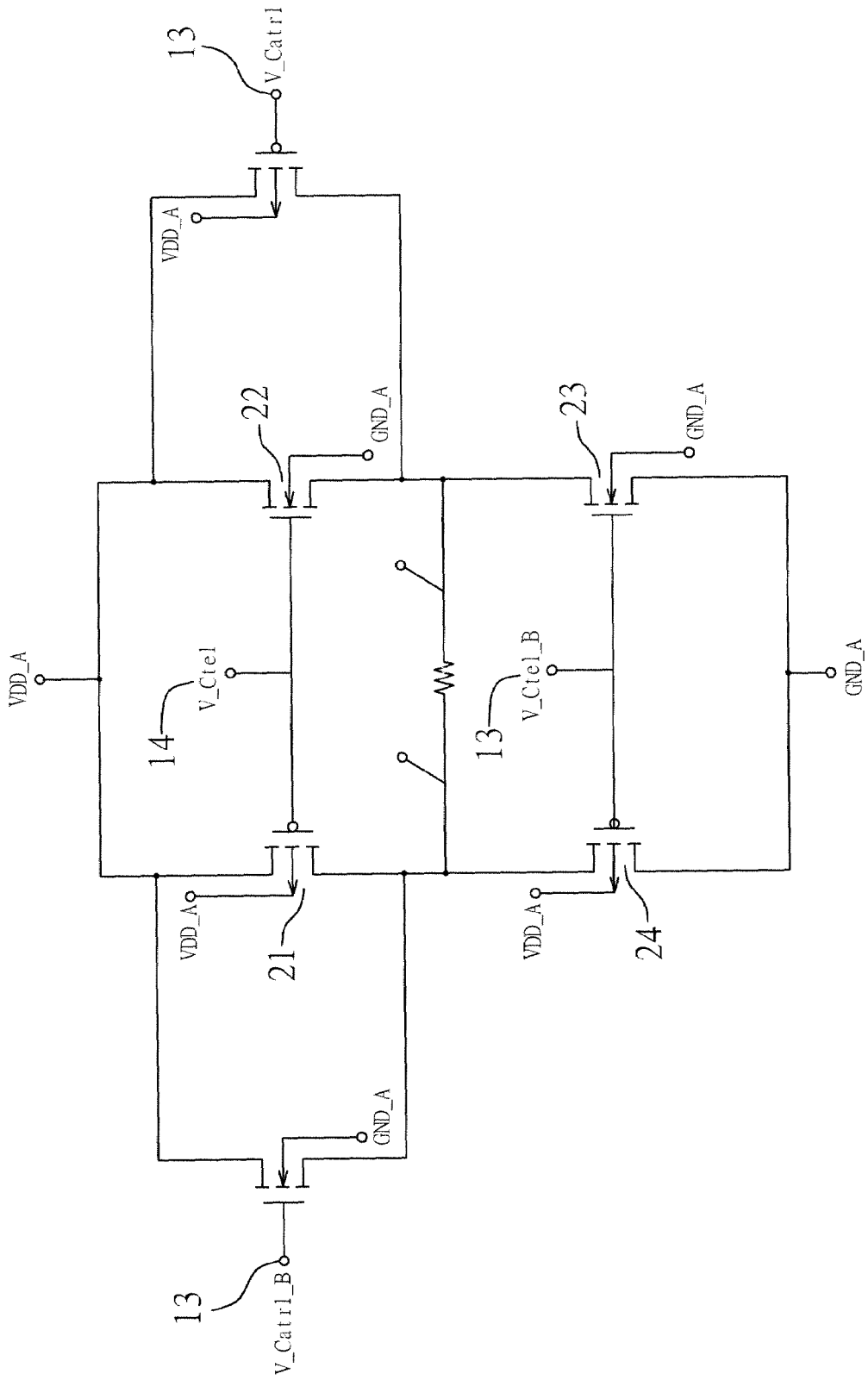
FIG. 11A is a schematic structure view of the memory structure according to the eighth embodiment of the present invention.
Figure 11B:
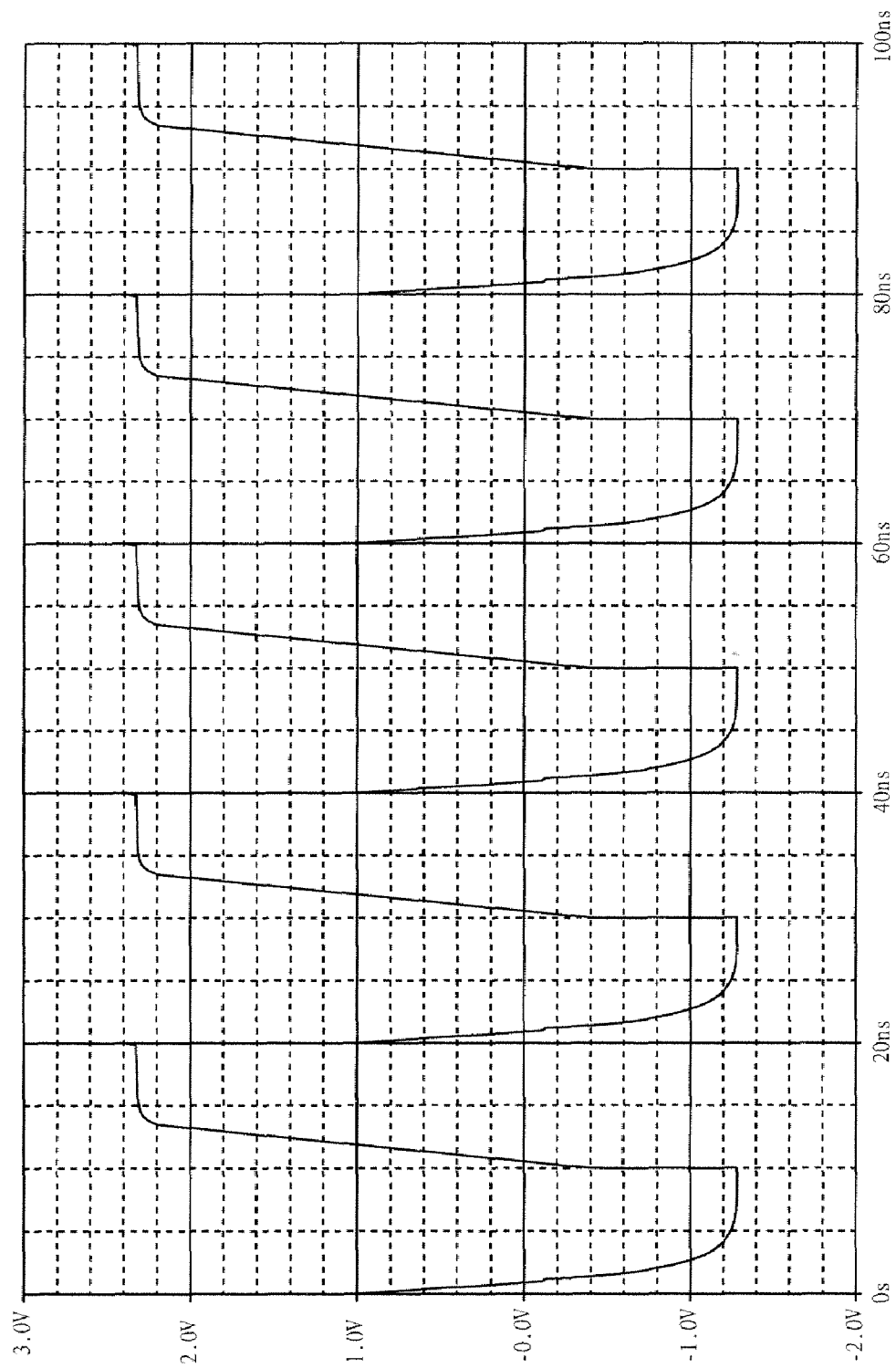
FIG. 11B is a graph showing the simulated waveform of the memory structure according to the eighth embodiment of the present invention.

As shown in FIGS. 11A and 11B, they are schematic diagrams showing the structure and the simulated waveform of the memory structure according to the eighth embodiment of the present invention. The present embodiment is most similar to the previous first embodiment, the only difference is that at the present embodiment, the first and second switches 21, 22 of the full bridge circuit is a transmission gate, the third switch 23 of the full bridge circuit is N-channel FET and the fourth switch 24 of the full bridge circuit is P-channel FET. Through the different characteristics of the FETs mentioned above, positive and negative pulses with different magnitude are generated.

Figure 12A:
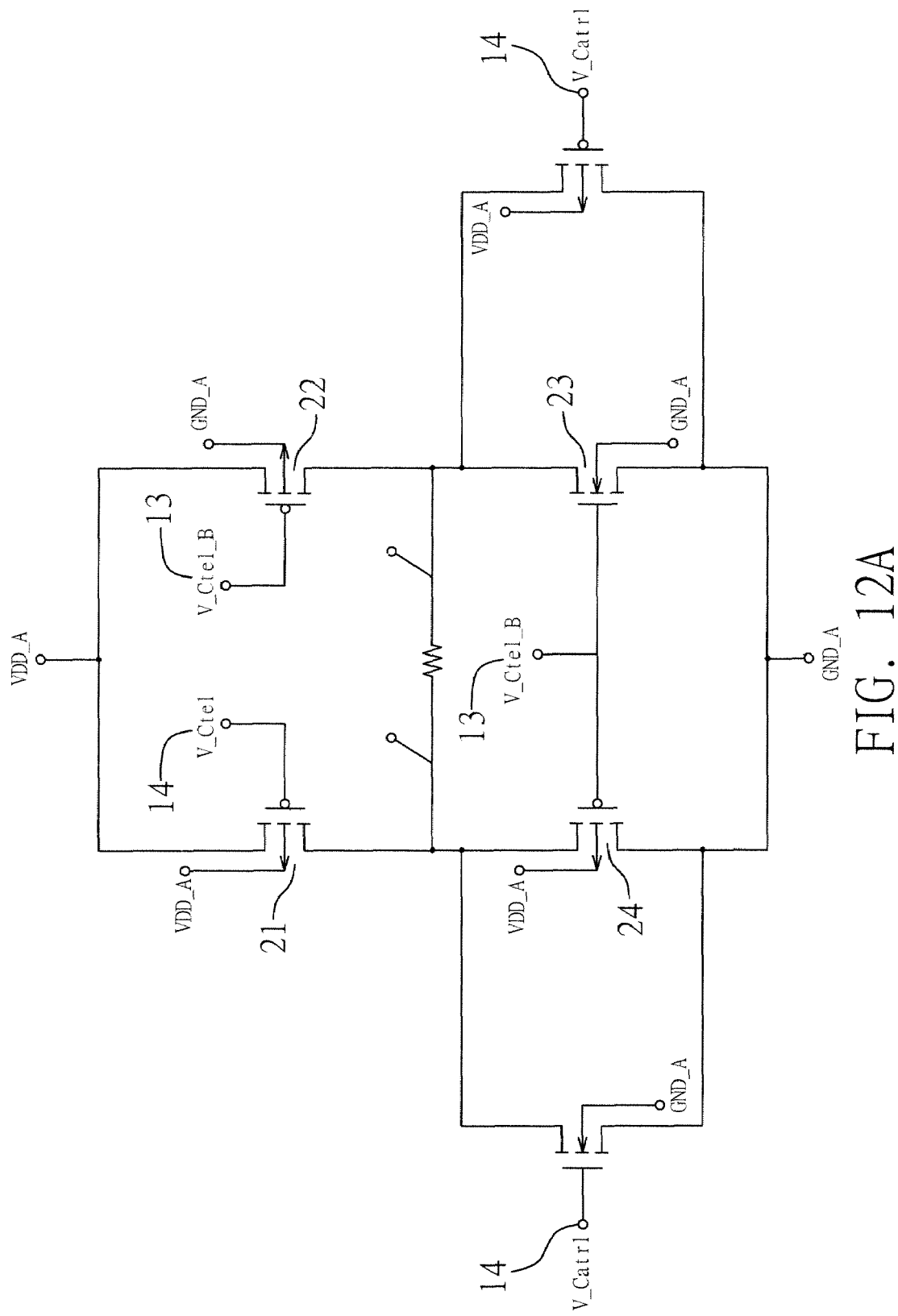
FIG. 12A is a schematic structure view of the memory structure according to the ninth embodiment of the present invention.
Figure 12B:
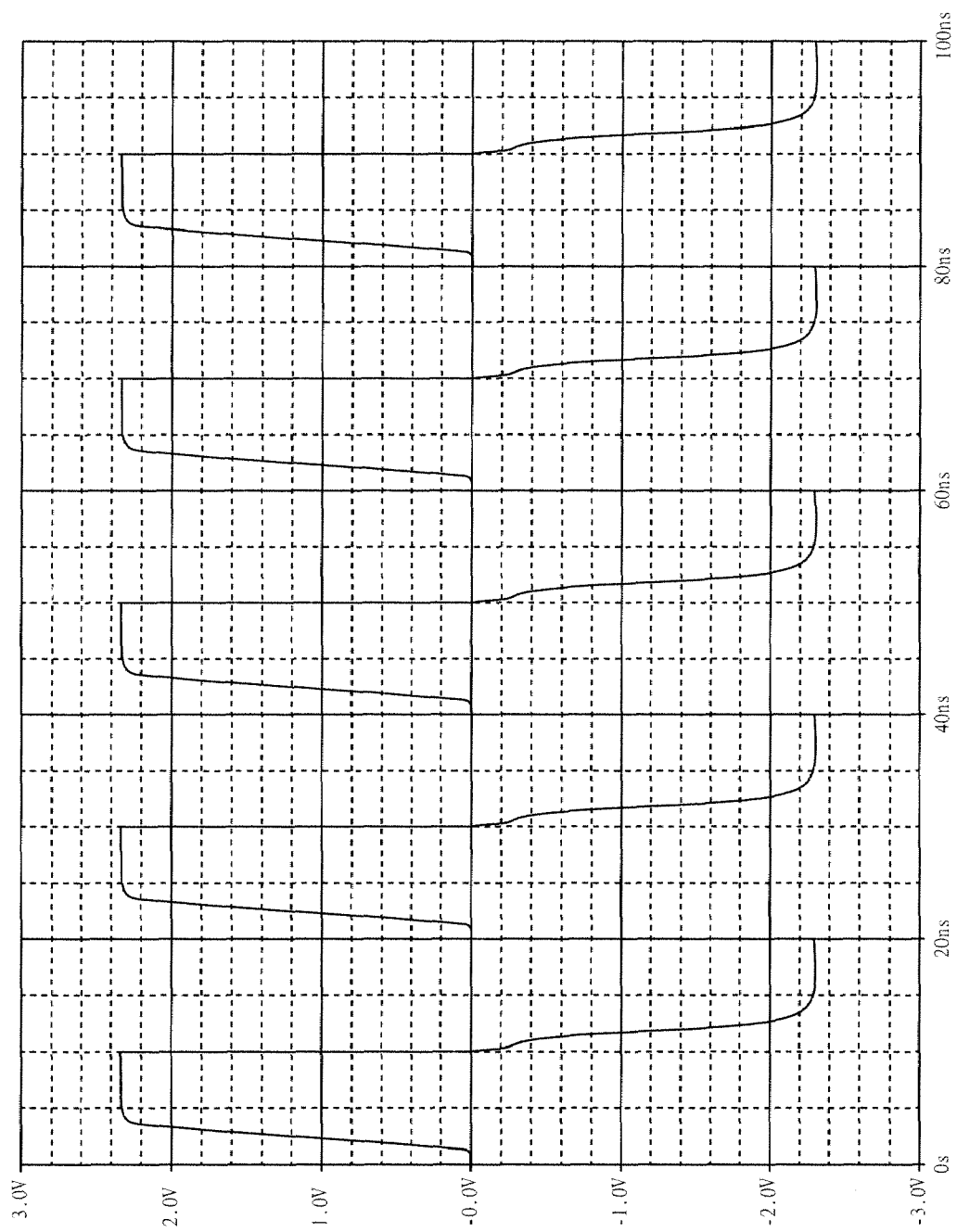
FIG. 12B is a graph showing the simulated waveform of the memory structure according to the ninth embodiment of the present invention.

As shown in FIGS. 12A and 12B, they are schematic diagrams showing the structure and the simulated waveform of the memory structure according to the ninth embodiment of the present invention. The present embodiment is most similar to the previous first embodiment, the only difference is that at the present embodiment, the third and fourth switches 23, 24 of the full bridge circuit is a transmission gate and the first and second switches 21, 22 of the full bridge circuit are P-channel FETs. Through the different characteristics of the FETs mentioned above, symmetrical positive and negative pulses are generated.

Figure 13A:
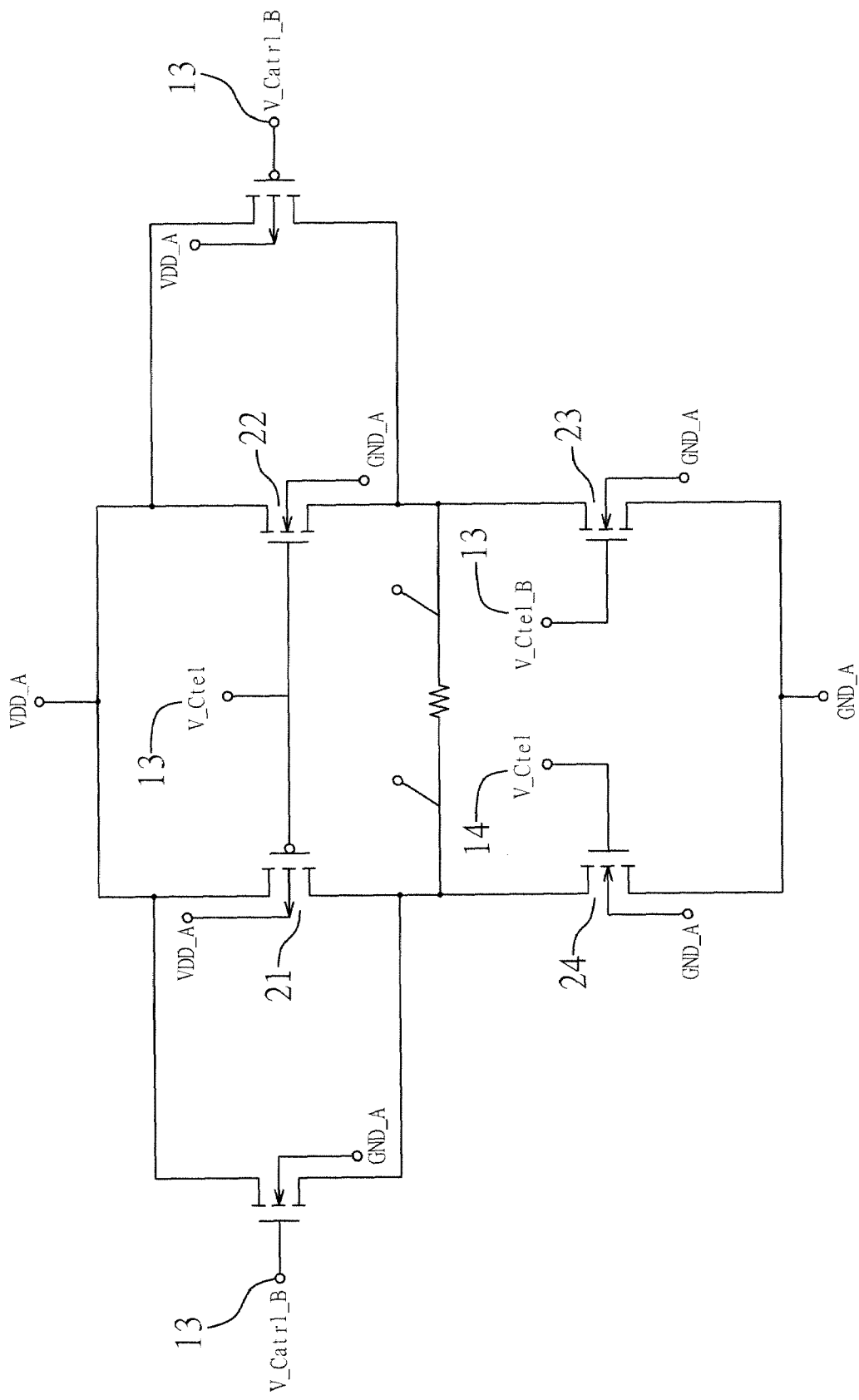
FIG. 13A is a schematic structure view of the memory structure according to the tenth embodiment of the present invention.
Figure 13B:
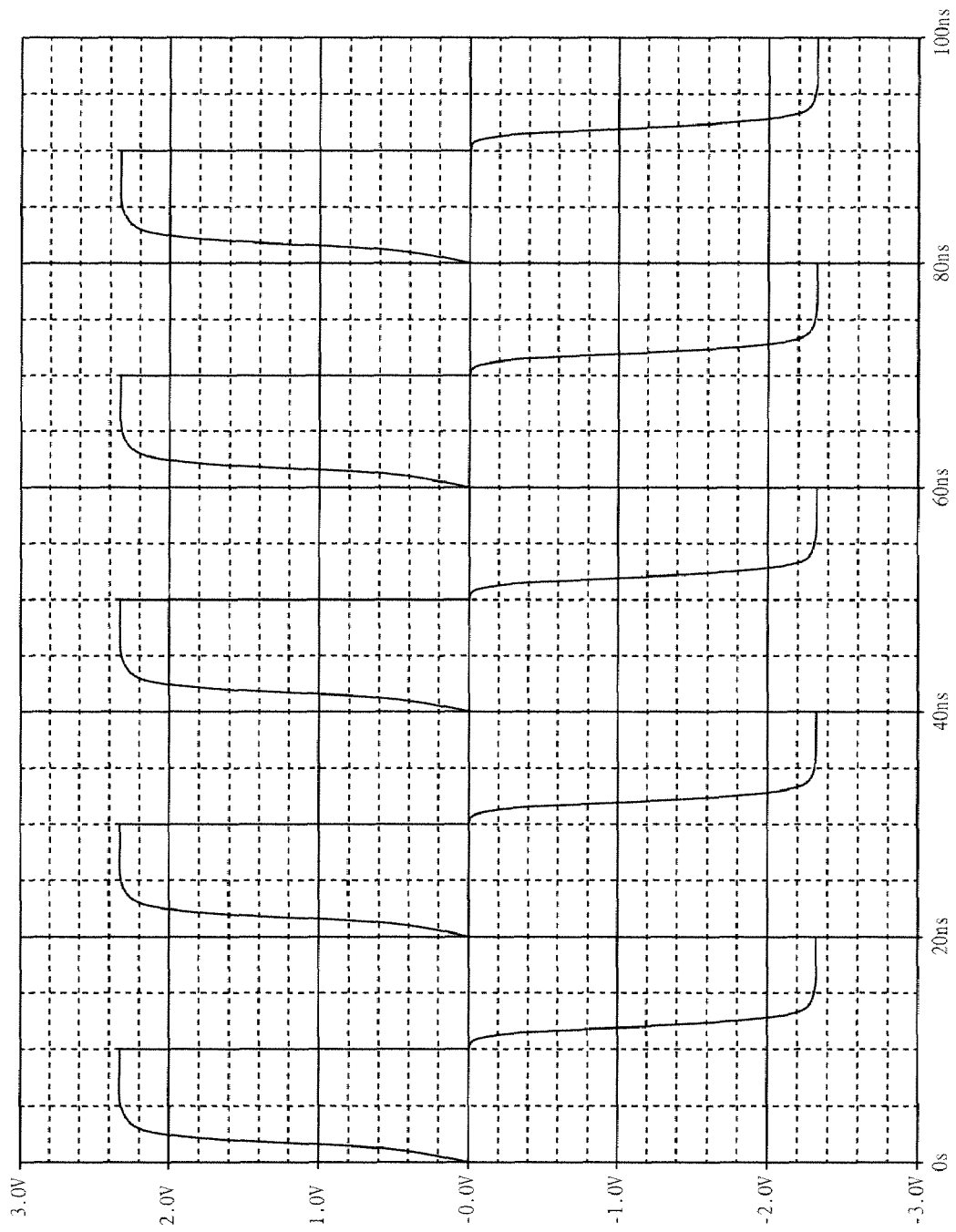
FIG. 13B is a graph showing the simulated waveform of the memory structure according to the tenth embodiment of the present invention.
Figure 14A:
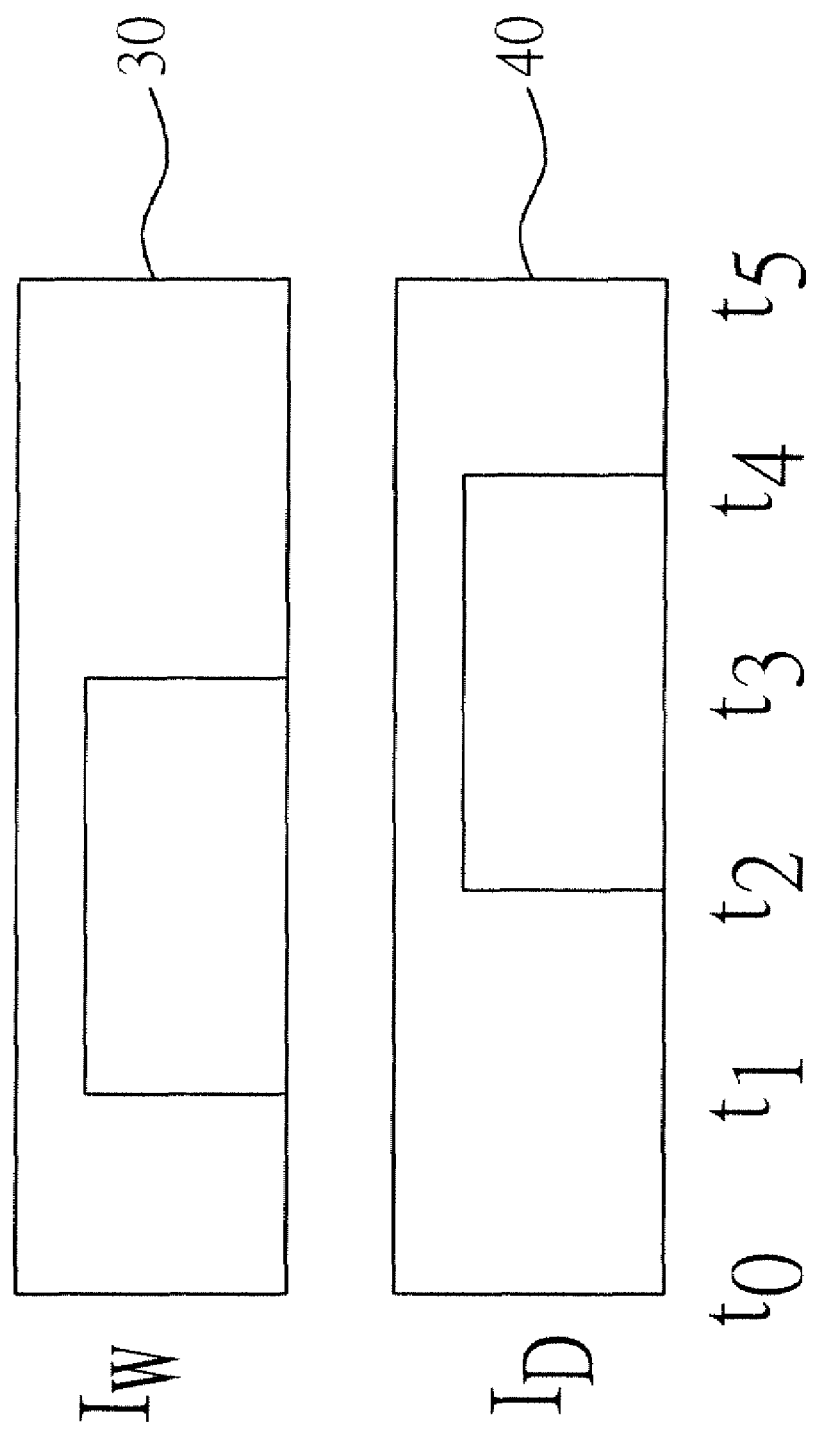
FIG. 14A is a schematic view showing the time sequence of the conventional magnetoresistive memory device according to the embodiment.
Figure 14D:
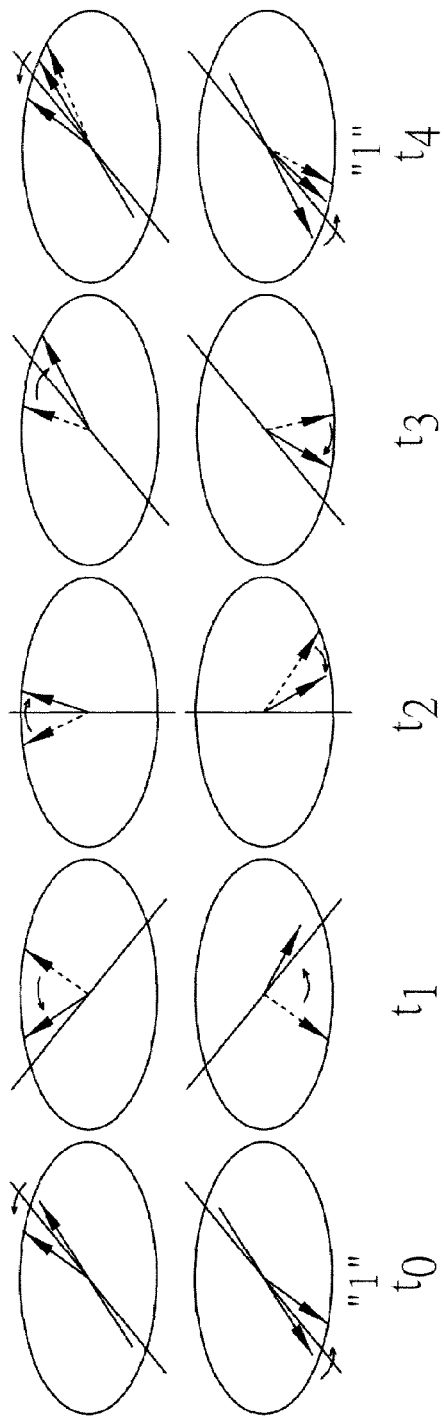
Figure 14E:
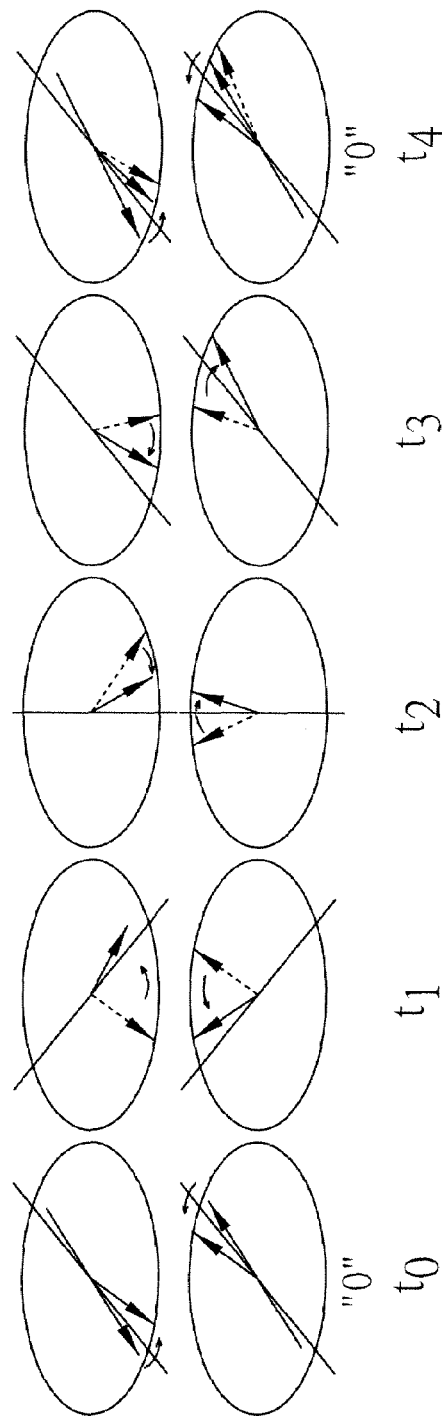

As shown in FIGS. 13A and 13B, they are schematic diagrams showing the structure and the simulated waveform of the memory structure according to the tenth embodiment of the present invention. The present embodiment is most similar to the previous first embodiment, the only difference is that at the present embodiment, the first and second switches 21, 22 of the full bridge circuit is a transmission gate and the third and fourth switches 23, 24 of the full bridge circuit are N-channel FETs. Through the different characteristics of the FETs mentioned above, symmetrical positive and negative pulses are generated.

In conclude with the description stated above, the memory structure of the present invention comprises a power supply circuit and a bridge circuit. Through the driving of the power supply circuit to let the bridge circuit switches between forward and backward, positive pulse, negative pulse and common pulse are generated. The memory structure is simple in configuration and only needs one set of power supply circuit, which means the current form the power supply circuit can be applied straight without knowing the resistance of the bit line in advance, hence this memory structure is easy to match with other peripheral equipment.

Moreover, the memory structure of the present invention can be altered according to different needs in reality. The memory structure can share or externally connect to different control signal respectively, and through the different characteristic of the P-channel FET and N-channel FET, the signal error is hardly occurred for the memory structure when switching between forward and backward. Also the forward and backward switch can be adjusted, thus the amount of the forward and backward current can be changed.

The present invention has been described using exemplary preferred embodiments above, however, it is to be understood that the scope of the present invention is not limited to the disclosed embodiments. On the contrary, it is intended to cover various modifications and similar changes. The scope of the claims, therefore, should be accorded the broadest interpretation so as to encompass all such modifications and similar arrangements.

What is claimed is:

1. A writing structure of a memory, for providing the memory with writing selection, the writing structure comprising:
    a power supply circuit having an input terminal and an output terminal; and
    a bridge circuit having a first switch, a second switch, a third switch and a fourth switch to form a two-phase circuit, two opposite junctions of the bridge circuit being connected to the input and output terminals, another two opposite junctions of the bridge circuit connected to a resistance component and serving as conduction paths for currents, the bridge circuit being driven by the power supply circuit and operating in a plurality of conduction modes including a first pulse, a second pulse and a third pulse.

2. The writing structure of a memory of claim 1, wherein the conduction modes comprise:
    when the first and third switches are conductive, and the second and fourth switches are not conductive, a first current is output from the input terminal of the power supply circuit and flow through the first switch to the resistance component of the bridge circuit to generate the first pulse, and flow through the third switch to the output terminal;
    when the second and fourth switches are conductive, and the first and third switches are not conductive, a second current is output from the input terminal of the power supply circuit and flow through the second switch to the resistance component of the bridge circuit to generate the second pulse, and flow through the fourth switch to the output terminal; and
    when the first, second, third and fourth switches are all not conductive, the third pulse is generated.

3. The writing structure of a memory of claim 1, wherein the bridge circuit comprises two P-channel field effect transistors (FET) and two N-channel FETs.

4. The writing structure of a memory of claim 1, wherein the bridge circuit is a combination of a P-channel FET, an N-channel FET and a transmission gate having a P-channel FET and an N-channel FET.

5. The writing structure of a memory of claim 3, wherein the P-channel FET and the N-channel FET form a positive half cycle drive and a negative half cycle drive.

6. The writing structure of a memory of claim 2, wherein the resistance component comprises a resistance of a bit line.

7. The writing structure of a memory of claim 1, wherein the first switch and the second switch share a first control signal, and the third switch and the fourth switch share a second control signal.

8. The writing structure of a memory of claim 1, wherein the first switch and the fourth switch share a first control signal, and the second switch and the third switch share a second control signal.

9. The writing structure of a memory of claim 1, wherein the resistance component comprises a resistance of a word line.

10. The writing structure of a memory of claim 1, wherein further a bit line, a word line and a magnetic tunneling junction, and the resistance component comprises the word line and the bit line.

11. A data writing method for a memory structure, the data writing method adopting a power supply circuit to generate a current to drive a bridge circuit to operate in a plurality of conduction modes, the conduction modes comprising:
    when a first and a third switches of the bridge circuit are conductive, and a second and a fourth switches of the bridge circuit are not conductive, a first current is output from an input terminal of the power supply circuit and flow through the first switch to a resistance component of the bridge circuit to generate a first pulse, and flow through the third switch to an output terminal of the power supply circuit;
    when the second and fourth switches are conductive, and the first and third switches are not conductive, a second current is output from the input terminal of the power supply circuit and flow through the second switch to the resistance component of the bridge circuit to generate a second pulse, and flow through the fourth switch to the output terminal; and
    when the first, second, third and fourth switches are all not conductive, a third pulse is generated.

12. The data writing method for the memory structure of claim 11, wherein the bridge circuit comprises two P-channel FETs and two N-channel FETs.

13. The data writing method for the memory structure of claim 12, wherein the P-channel FET and the N-channel FET form a positive half cycle drive and a negative half cycle drive.

14. The data writing method for the memory structure of claim 11, wherein the bridge circuit is a combination of a P-channel FET, an N-channel FET and a transmission gate having a P-channel FET and an N-channel FET.

15. The data writing method for the memory structure of claim 11, wherein the bridge circuit further comprises a resistance component.

16. The data writing method for the memory structure of claim 15, wherein the resistance component comprises a resistance of a bit line.

17. The data writing method for the memory structure of claim 15, wherein the resistance component comprises a resistance of a word line.

18. The data writing method for the memory structure of claim 15, wherein further a bit line, a word line and a magnetic tunneling junction, and the resistance component comprises the word line and the bit line.

19. The data writing method for the memory structure of claim 11, wherein the first switch and the second switch share a first control signal, and the third switch and the fourth switch share a second control signal.

20. The data writing method for the memory structure of claim 11, wherein the first switch and the fourth switch share a first control signal, and the second switch and the third switch share a second control signal.

* * * * *